United States Patent
Kuboi et al.

(10) Patent No.: US 8,535,550 B2
(45) Date of Patent: Sep. 17, 2013

(54) SHAPE SIMULATION APPARATUS, SHAPE SIMULATION PROGRAM, SEMICONDUCTOR PRODUCTION APPARATUS, AND SEMICONDUCTOR DEVICE PRODUCTION METHOD

(75) Inventors: Nobuyuki Kuboi, Tokyo (JP); Takashi Kinoshita, Kanagawa (JP); Tetsuya Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 289 days.

(21) Appl. No.: 12/858,249

(22) Filed: Aug. 17, 2010

(65) Prior Publication Data
US 2011/0082577 A1   Apr. 7, 2011

(30) Foreign Application Priority Data

Aug. 24, 2009   (JP) ................................. 2009-193334

(51) Int. Cl.
*G06F 19/00* (2011.01)
(52) U.S. Cl.
USPC .................... 216/59; 700/99; 700/100; 703/6

(58) Field of Classification Search
USPC ............. 216/59, 61, 62; 700/99, 100; 703/2, 703/6; 716/51, 52
See application file for complete search history.

(56) References Cited

U.S. PATENT DOCUMENTS

| | | | | |
|---|---|---|---|---|
| 5,070,469 A | * | 12/1991 | Kunikiyo et al. | 703/2 |
| 5,502,643 A | * | 3/1996 | Fujinaga | 716/51 |
| 6,009,255 A | * | 12/1999 | Shinzawa | 703/6 |
| 6,658,640 B2 | * | 12/2003 | Weed | 716/52 |
| 7,665,060 B2 | * | 2/2010 | Luc-Pat et al. | 716/52 |

FOREIGN PATENT DOCUMENTS

| | | |
|---|---|---|
| JP | 2007-234867 | 9/2007 |
| JP | 2009-152269 | 7/2009 |

* cited by examiner

*Primary Examiner* — Kidest Bahta
(74) *Attorney, Agent, or Firm* — Robert J. Depke; The Chicago Technology Law Group, LLC

(57) ABSTRACT

Disclosed herein is a shape simulation apparatus including: a flux computation block configured to compute the flux of particles incident on the surface of a wafer covered with a mask; and a shape computation block configured to compute a surface shape of the wafer by allowing the coordinates of a plurality of calculation points established on the surface of the wafer to be time-evolved based on the incident flux computed.

12 Claims, 16 Drawing Sheets

FIG.11A

|  | POINT 1 | POINT 2 |  | POINT j | POINT j+1 |  | POINT m-1 | POINT m |
|---|---|---|---|---|---|---|---|---|
| CELL 1 | 3.14 | 0.73 | .... | 1.03 | 1.03 | .... | 0.73 | 3.14 |
| ⋮ | ⋮ | ⋮ | ⋮ | ⋮ | ⋮ | ⋮ | ⋮ | ⋮ |
| CELL i | 3.14 | 1.56 | .... | 1.59 | 1.59 | .... | 1.56 | 3.14 |
| ⋮ | ⋮ | ⋮ | ⋮ | ⋮ | ⋮ | ⋮ | ⋮ | ⋮ |
| CELL n-1 | 3.14 | 1.13 | .... | 1.01 | 1.01 | .... | 1.13 | 3.14 |
| CELL n | 3.14 | 1.13 | .... | 1.01 | 1.01 | .... | 1.13 | 3.14 |

FIG.11B

|  | POINT 1 | POINT 2 |  | POINT j | POINT j+1 |  | POINT m-1 | POINT m |
|---|---|---|---|---|---|---|---|---|
| CELL 1 | 67.1 | 66.7 | .... | 65.9 | 65.9 | .... | 66.7 | 67.1 |
| ⋮ | ⋮ | ⋮ | ⋮ | ⋮ | ⋮ | ⋮ | ⋮ | ⋮ |
| CELL i | 66.9 | 66.9 | .... | 66.0 | 66.0 | .... | 66.9 | 66.9 |
| ⋮ | ⋮ | ⋮ | ⋮ | ⋮ | ⋮ | ⋮ | ⋮ | ⋮ |
| CELL n-1 | 66.8 | 66.8 | .... | 66.3 | 66.3 | .... | 66.8 | 66.8 |
| CELL n | 66.8 | 66.8 | .... | 66.2 | 66.2 | .... | 66.8 | 66.8 |

SHAPE SIMULATION APPARATUS, SHAPE SIMULATION PROGRAM, SEMICONDUCTOR PRODUCTION APPARATUS, AND SEMICONDUCTOR DEVICE PRODUCTION METHOD

The present application claims priority to Japanese Patent Application JP 2009-193334 filed in the Japanese Patent Office on Aug. 24, 2009, the entire content of which is hereby incorporated by reference.

BACKGROUND OF THE INVENTION

1. Field of the Invention

The present invention relates to a shape simulation apparatus, a shape simulation program, a semiconductor production apparatus, and a semiconductor device production method.

2. Description of the Related Art

There exist techniques for simulating the wafer surface shape that varies with etching and deposition. Japanese Patent Laid-open No. 2009-152269 (hereinafter referred to as Patent Document 1) illustratively discloses a simulation method that takes into account of how the aperture ratio of the wafer and the effective solid angles of local patterns affect plasma etching. The wafer aperture ratio and the effective solid angles of local patterns will be discussed later. Taking the effects of these parameters into account makes it possible to consider three-dimensionally the effects of the shape of mask patterns on two-dimensional simulation.

SUMMARY OF THE INVENTION

Experiments conducted by the inventors confirmed that when a plurality of patterns of the same shape (e.g., gate electrodes) are etched, there occur dimensional discrepancies between the actual products even if the wafer aperture ratio and effective solid angle are the same for the multiple patterns involved. Hence the need for clarifying any additional factors affecting the product dimensions in order to improve the accuracy of shape prediction.

The present invention has been made in view of the above circumstances and provides a shape simulation apparatus, a shape simulation program, a semiconductor production apparatus, and a semiconductor device production method for improving the accuracy of shape simulation.

In carrying out the present invention and according to one embodiment thereof, there is provided a shape simulation apparatus including: a flux computation block configured to compute the flux of particles incident on the surface of a wafer covered with a mask; and a shape computation block configured to compute a surface shape of the wafer by allowing the coordinates of a plurality of calculation points established on the surface of the wafer to be time-evolved based on the incident flux computed. In the shape simulation apparatus, the flux computation block computes the incident flux based on a solid angle, as seen from the calculation point of interest, of that range of a local region which includes the calculation point of interest and which is left unshielded by any pattern inside the local region; on a wafer aperture ratio of the aperture area of the mask to the area of the mask; and on a semilocal aperture ratio of the aperture area of the mask over the semilocal region to the area of a semilocal region which includes the local region and which is narrower than the wafer.

Preferably, the flux computation block may compute a distribution of the incident fluxes based on a distribution of the solid angles, on the wafer aperture ratio, and on a distribution of the semilocal aperture ratios; and the shape computation block may compute a three-dimensional surface shape based on the distribution of the incident fluxes.

Preferably, the flux computation block may compute the incident flux in such a manner that of the incident fluxes, those attributable to an etched film become proportional to the solid angles as well as to the sum of the wafer aperture ratios and the semilocal aperture ratios.

Preferably, the local region and the semilocal region may be established in a manner centering on each of the calculation points.

Preferably, the shape simulation apparatus of the embodiment of the present invention may further include a semilocal aperture ratio map creation block configured to store a plurality of calculation points in association with a plurality of semilocal aperture ratios into a storage block; wherein the flux computation block may compute the incident flux by referencing the plurality of semilocal aperture ratios stored in the storage block.

Preferably, the wafer may have a plurality of chip regions disposed thereon; and the semilocal region may be established to be smaller than each of the plurality of chip regions.

Preferably, the radius of the semilocal region may be larger than a mean free path of any one of the particles.

According to another embodiment of the present invention, there is provided a shape simulation program including the steps of: causing a computer to function as a flux computation block computing the flux of particles incident on the surface of a wafer covered with a mask; and causing the computer to function as a shape computation block computing a surface shape of the wafer by allowing the coordinates of a plurality of calculation points established on the surface of the wafer to be time-evolved based on the incident flux computed. In the program, the flux computation block is caused to compute the incident flux based on a solid angle, as seen from the calculation point of interest, of that range of a local region which includes the calculation point of interest and which is left unshielded by any pattern inside the local region; on a wafer aperture ratio of the aperture area of the mask to the area of the mask; and on a semilocal aperture ratio of the aperture area of the mask over the semilocal region to the area of a semilocal region which includes the local region and which is narrower than the wafer.

According to a further embodiment of the present invention, there is provided a semiconductor production apparatus including: a detection section configured to detect parameters of an etching process being performed on a wafer covered with a mask; a simulation section configured to perform a simulation of a surface shape of the wafer; and a control section configured to acquire results of the simulation performed by the simulation section in keeping with the parameters detected by the detection section, so as to correct the etching parameters based on the acquired simulation results. In the semiconductor production apparatus, the simulation section includes: a flux computation block configured to compute the flux of particles incident on the surface of the wafer; and a shape computation block configured to compute the surface shape of the wafer by allowing the coordinates of a plurality of calculation points established on the surface of the wafer to be time-evolved based on the incident flux computed. The flux computation block computes the incident flux based on a solid angle, as seen from the calculation point of interest, of that range of a local region which includes the calculation point of interest and which is left unshielded by any pattern inside the local region; on a wafer aperture ratio of the aperture area of the mask to the area of the mask; and on a semilocal aperture ratio of the aperture area of the mask over the semilocal region to the area of a semilocal region which includes the local region and which is narrower than the wafer.

According to an even further embodiment of the present invention, there is provided a semiconductor device production method including the steps of: detecting parameters of an etching process being performed on a wafer covered with a mask; performing a simulation of a surface shape of the wafer; and acquiring results of the simulation performed in the simulation performing step in keeping with the parameters detected in the detecting step, so as to correct the etching parameters based on the acquired simulation results. The simulation performing step includes: computing the flux of particles incident on the surface of the wafer; and computing the surface shape of the wafer by allowing the coordinates of a plurality of calculation points established on the surface of the wafer to be time-evolved based on the incident flux computed. The flux computing step computes the incident flux based on a solid angle, as seen from the calculation point of interest, of that range of a local region which includes the calculation point of interest and which is left unshielded by any pattern inside the local region; on a wafer aperture ratio of the aperture area of the mask to the area of the mask; and on a semilocal aperture ratio of the aperture area of the mask over the semilocal region to the area of a semilocal region which includes the local region and which is narrower than the wafer.

According to the present inventions outlined above, the accuracy of simulations is improved.

BRIEF DESCRIPTION OF THE DRAWINGS

Further features and advantages of the present invention will become apparent upon a reading of the following description and appended drawings in which:

FIGS. 11A and 11B are conceptual views of map data of effective solid angles and semilocal aperture ratios;

DETAILED DESCRIPTION OF THE PREFERRED EMBODIMENTS

Figure 1A:
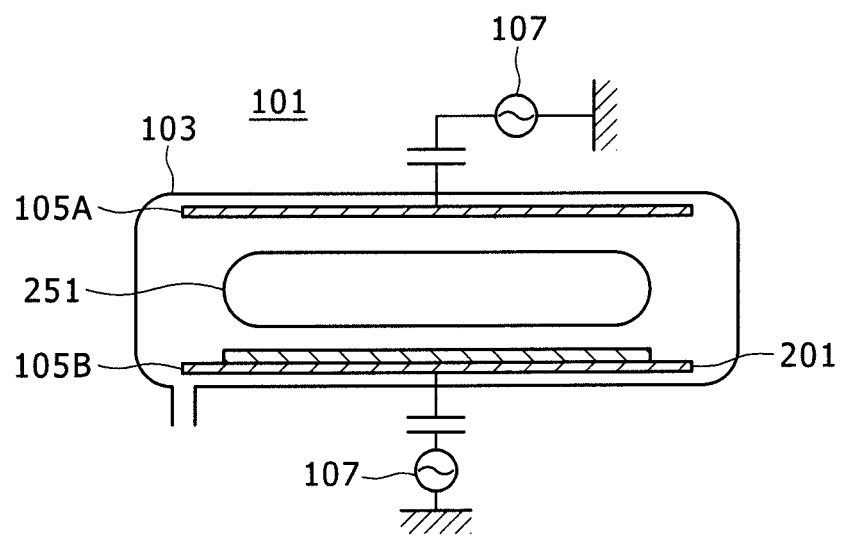
FIGS. 1A and 1B are schematic views explanatory of the target to be simulated by a simulation apparatus implemented as a first embodiment of the present invention.

Some preferred embodiments of the present invention will now be described under the following headings:

1. First embodiment (as a simulation apparatus);
2. Second embodiment (as a simulation apparatus that performs global calculations);
3. Third embodiment (as a semiconductor production apparatus that utilizes a database of simulation results); and
4. Fourth embodiment (as a semiconductor production apparatus that performs simulation during etching).

In the ensuing description of the plurality of embodiments, like reference numerals designate like or corresponding parts, and descriptions of these parts may be omitted where redundant.

1. First Embodiment

[Simulation Target]

Figure 1B:
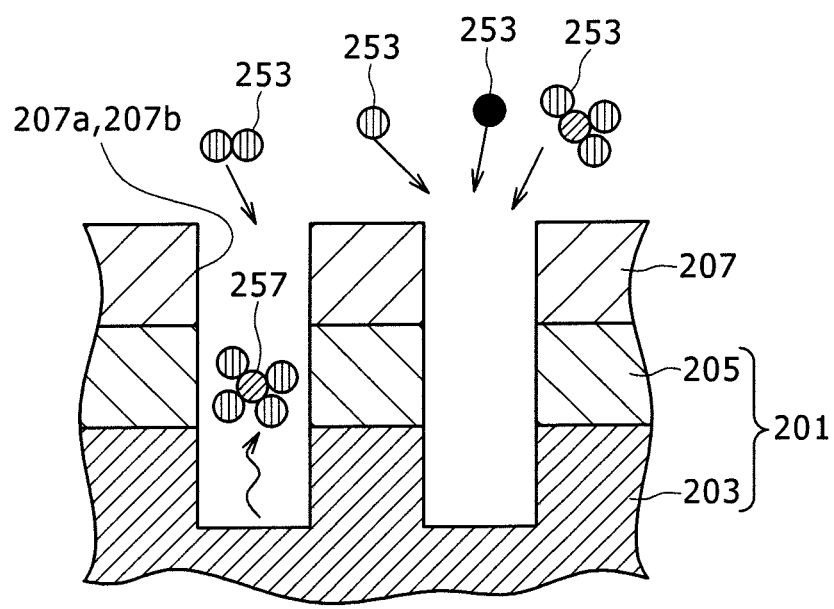

FIGS. 1A and 1B are schematic views explanatory of the target to be simulated by a simulation apparatus 1 (see FIG. 2) implemented as the first embodiment of the present invention. Specifically, FIG. 1A is a schematic sectional view of etching equipment 101 and a wafer 201 to be simulated.

The etching equipment as the target of simulation may be any apparatus capable of dry etching. Illustratively, reactive ion etching (RIE) equipment or reactive gas etching equipment may be targeted for simulation. What follows is a description of typical etching equipment that performs RIE.

The etching method used by the RIE equipment may illustratively be CCP (capacitive coupled plasma), ICP (inductive coupled plasma), or ECR (electron cyclotron resonance).

FIG. 1A shows typical CCP type etching equipment 101. The etching equipment 101 includes an etching chamber 103, an upper electrode 105A and a lower electrode 105B positioned opposite each other inside the chamber 103, and a power supply device 107 that supplies power to these electrodes.

The wafer 201 is placed on top of the lower electrode 105B. When power is applied to the upper electrode 105A and lower electrode 105B, the gas above the wafer 201 turns into plasma 251 causing the surface of the wafer 201 to be etched.

FIG. 1B is an enlarged schematic sectional view of the surface of the wafer 201. In this specification, the word "wafer" refers to both the semiconductor substrate (in the narrow sense) before being processed (e.g., doped with impurities or etched) and the substrate having been wired and otherwise processed.

Plasma etching takes place as follows: a mask 207 is formed on the wafer 201. Apertures 207a are formed in the mask 207 in a predetermined pattern. Particles 253 (i.e., ions and radicals) of the plasma 251 enter the surface of the wafer 201 through the apertures 207a. The radicals chemically react with the wafer 201 to produce reaction products 257 that break away from the wafer 201. The ions effect sputtering and help the radicals to produce and/or detach the reaction products 257.

Any layer on the wafer 201 may be etched. For purpose of description, a semiconductor layer 203 on the wafer 201 and an anti-reflective layer 205 deposited on the semiconductor layer 203 are assumed to be etched. The semiconductor layer 203 is a substrate portion typically formed by silicon (Si) and constitutes a wafer in the narrow sense. The anti-reflective layer 205 is the so-called BARC (bottom anti-reflective coating).

[Structure of the Simulation Apparatus]

Figure 2:
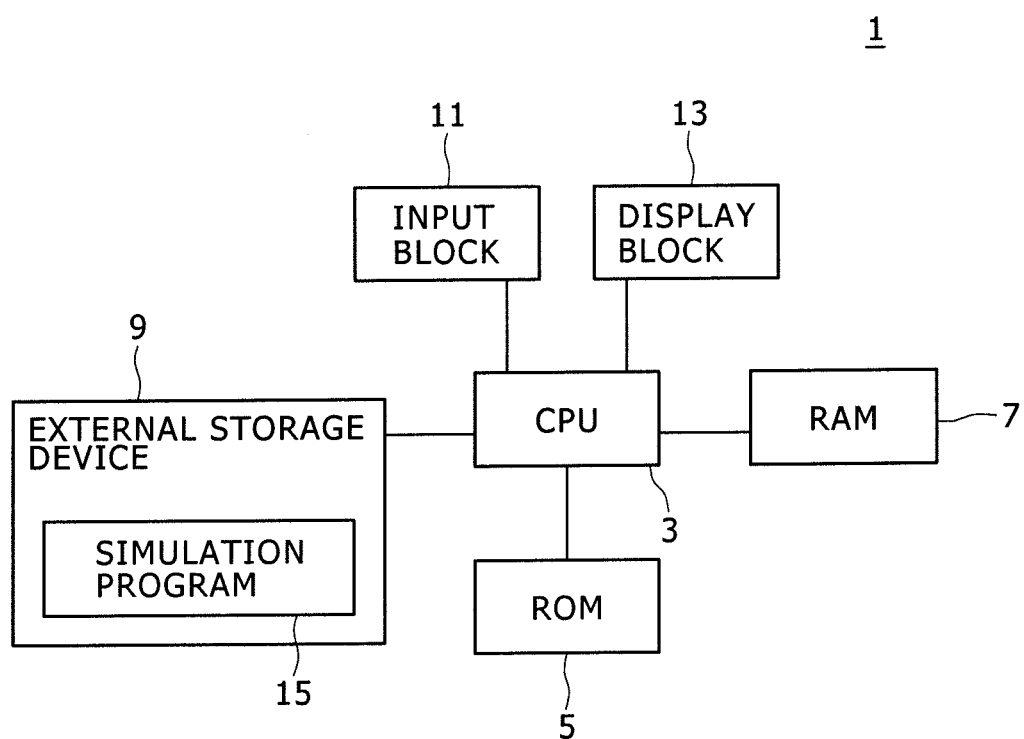
FIG. 2 is a block diagram outlining a typical structure of the simulation apparatus shown in FIGS. 1A and 1B.

FIG. 2 is a block diagram outlining a typical structure of the simulation apparatus 1.

The simulation apparatus 1 is illustratively composed of a computer that includes a CPU 3, a ROM 5, a RAM 7, an external storage device 9, an input block 11, and a display block 13. The CPU 3 reads a simulation program 15 from the external storage device 9 and executes the retrieved program 15. The simulation program 15 being executed enables the computer to function as the simulation apparatus 1 of diverse features.

Figure 3:
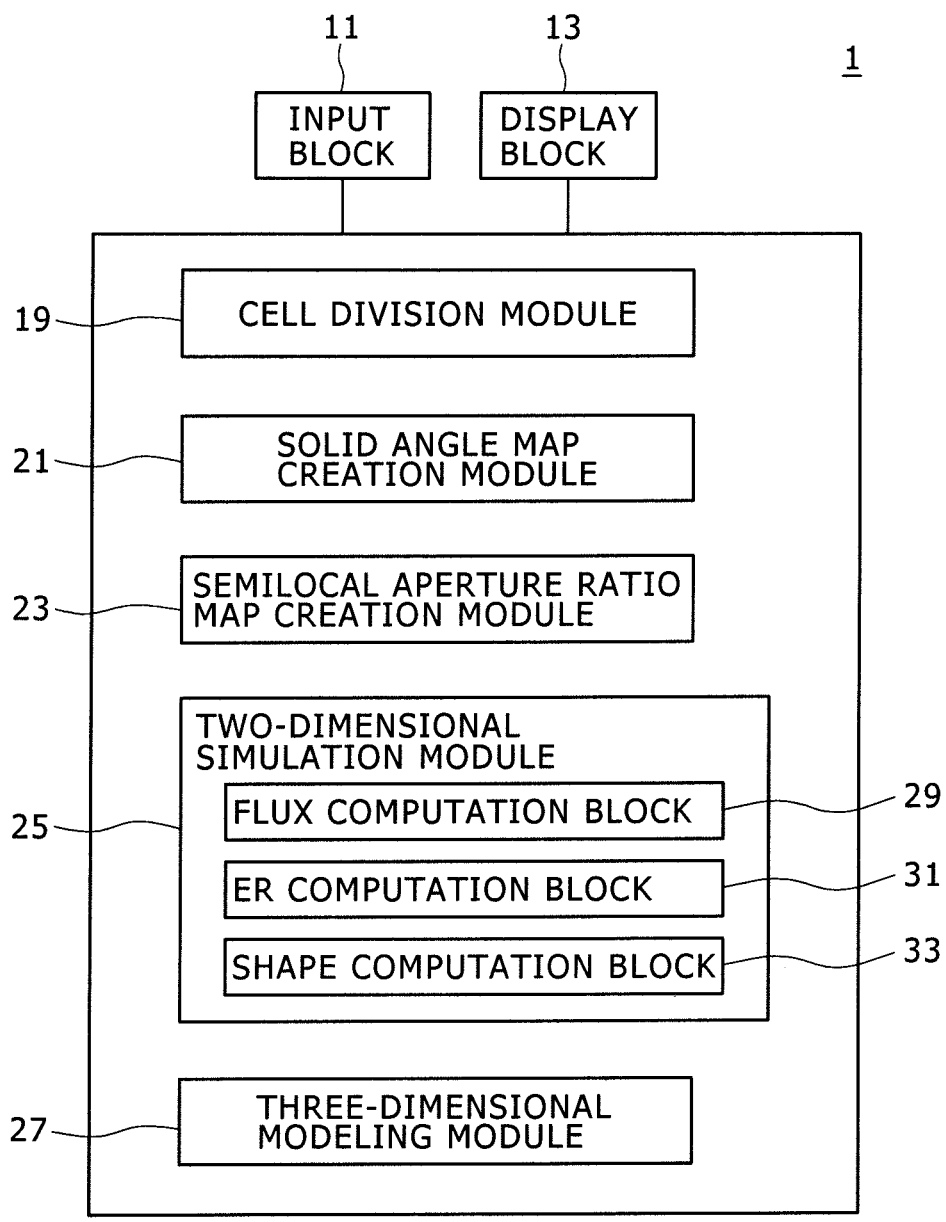
FIG. 3 is a functional block diagram outlining the functions of the simulation apparatus in FIGS. 1A and 1B.

FIG. 3 is a functional block diagram outlining the functions of the simulation apparatus 1.

As means for making the preparations for time-evolution computation (simulation in the narrow sense), the simulation apparatus 1 has a cell division module 19, a solid angle map creation module 21, and a semilocal aperture ratio map creation module 23.

The simulation apparatus 1 also has a two-dimensional simulation module 25 that carries out time-evolution computation. The two-dimensional simulation module 25 includes a flux computation block 29 that computes the incident flux of particles 253, an ER computation block 31 that computes etching rates (ER), and a shape computation block 33 that computes the surface shape of the wafer 201.

Furthermore, the simulation apparatus 1 possesses a three-dimensional module 27 that computes a three-dimensional shape of the wafer 201 on the basis of two-dimensional simulation results.

[Operation of the Simulation Apparatus]

(Overview of the Operation)

Figure 4:
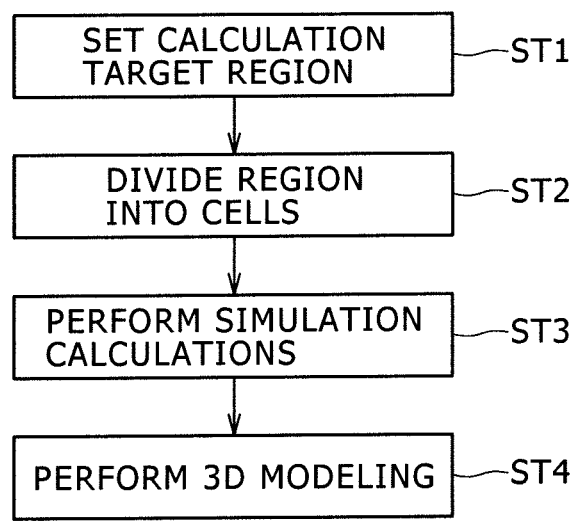
FIG. 4 is a flowchart outlining a simulation procedure executed by the simulation apparatus in FIGS. 1A and 1B.

FIG. 4 is a flowchart outlining a simulation procedure executed by the simulation apparatus 1.

In operation, the simulation apparatus 1 establishes a calculation target region in step ST1, divides the calculation target region into cells in step ST2, performs simulation calculations of each cell in step ST3, and performs three-dimensional modeling of the calculation results in step ST4.

Figure 5A:
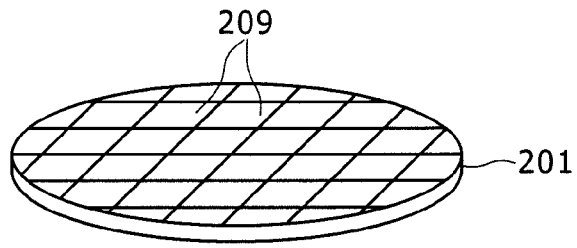
FIGS. 5A, 5B and 5C are schematic views explanatory of how a calculation target region is established in step ST1 of FIG. 4.
Figure 5B:
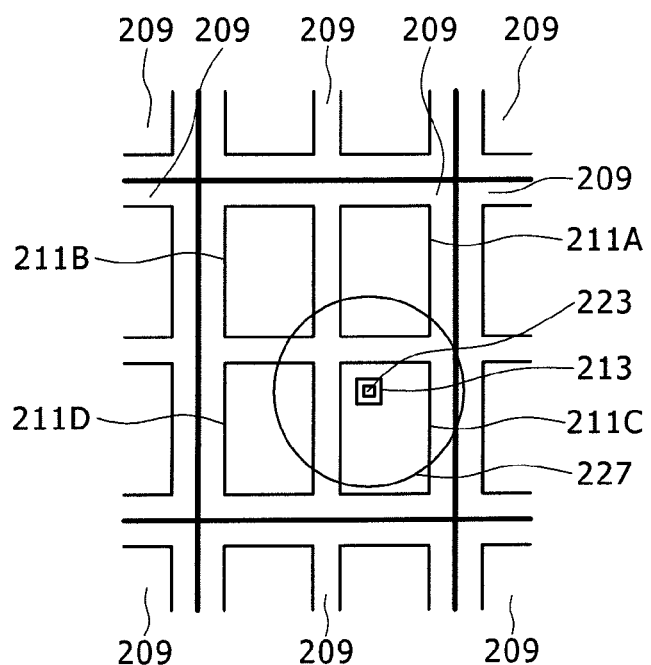
Figure 5C:
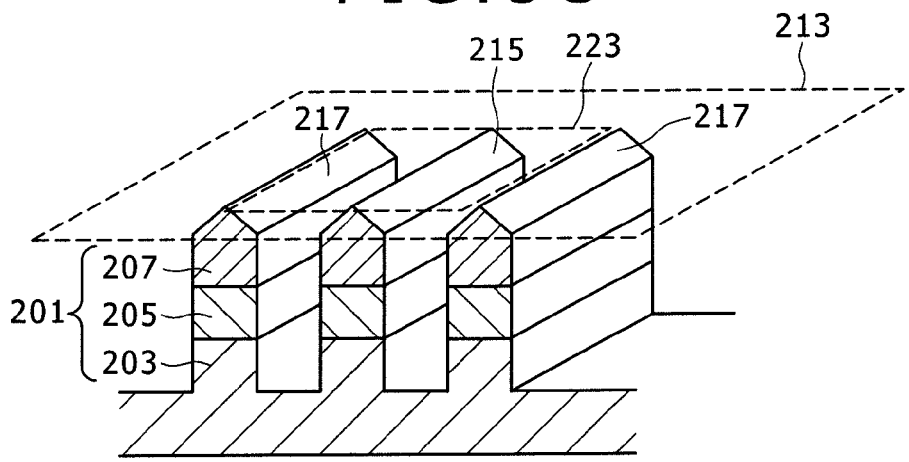

FIGS. 5A, 5B and 5C are schematic views explanatory of how the calculation target region is established in step ST1 of FIG. 4.

The calculation target region is a predetermined range of the wafer 201 subject to simulation. The calculation target region may be established illustratively by a user operating the input block 11. The first embodiment of the invention will be explained using an example in which the calculation target region is limited to a relatively narrow range. The example is detailed below.

FIG. 5A is a schematic perspective view of the wafer 201. A plurality of devices (i.e., chip regions) 209 are formed in the wafer 201. The plurality of devices 209 have the same structure and are arrayed vertically and horizontally as viewed on the plan view of the wafer 201. In other words, the surface shape of the wafer 201 is constituted by a plurality of identical patterns being arrayed regularly. In the mask 207, a plurality of aperture patterns 207b (see FIG. 1B) are formed corresponding to the plurality of devices 209.

The plan view shape of each of the devices 209 is typically rectangular. One side of the device 209 illustratively measures 20 to 30 mm.

FIG. 5B is a schematic plan view of a device 209. Inside each device 209, various patterns are formed in predetermined locations. That is, unlike the surface shape of the wafer 201 as a whole, the surface shape of each device 209 is not formed by identical patterns being arrayed regularly.

For example, if the device 209 is an imager, then pixel and logic blocks coexist inside the device 209. Hence the pattern is different depending on the location in the device 209.

FIG. 5B is arranged schematically to show characteristics of the patterns of the device 209. For that reason, the device 209 is assumed to have a plurality of function blocks 211A through 211D (which may be generically called the function block 211 hereunder where appropriate) that are functionally different from one another.

In FIG. 5B, a calculation target region 213 is shown established as part of the function block 211C.

FIG. 5C is a schematic perspective view of the calculation target region 213.

For purpose of explanation of this embodiment, the user is assumed to be desirous of predicting the shape of a wall-like target pattern 215. The target pattern 215 is flanked by two wall-like surrounding patterns 217. Illustratively, the target pattern 215 and the surrounding patterns 217 are a gate electrode each.

In the example of FIG. 5C, the calculation target region 213 is established in a manner including the target pattern 215 and the surrounding patterns 217. The shape and dimensions of the calculation target region 213 may be established as desired. FIG. 5C shows that the calculation target region 213 has one of its sides set to be rectangular in shape and to measure between hundreds of nanometers (nm) and several micrometers (μm).

Figure 6A:
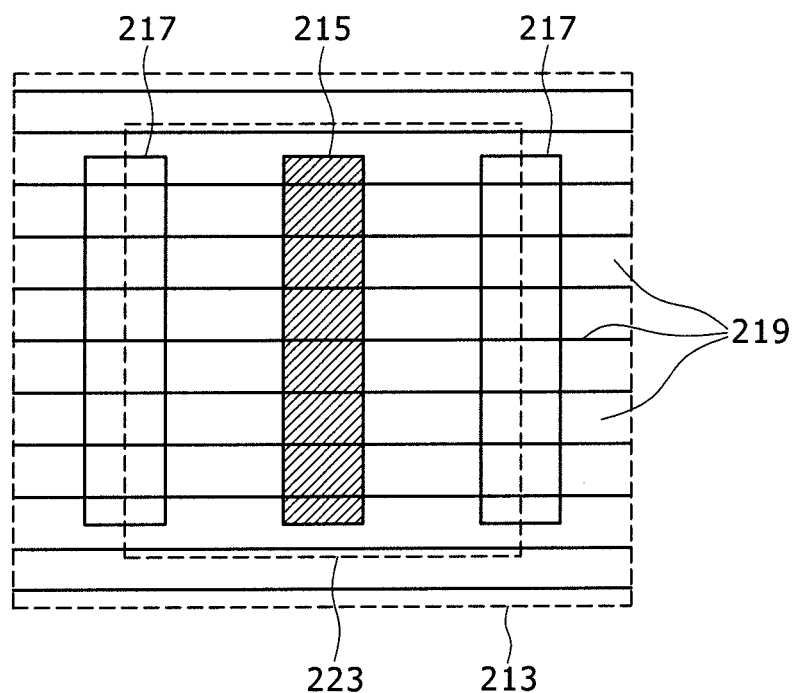
FIGS. 6A and 6B are schematic views explanatory of how the region of interest is divided into cells in step ST2 of FIG. 4.
Figure 6B:
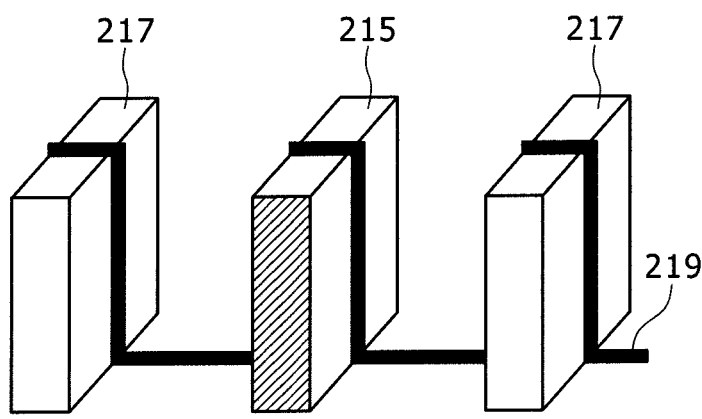

FIGS. 6A and 6B are schematic views explanatory of how the calculation target region 213 is divided into a plurality of cells 219 in step ST2 of FIG. 4. More specifically, FIG. 6A is a schematic plan view of a plurality of cells 219, and FIG. 6B is a schematic perspective view of a single cell 219.

With this embodiment, a two-dimensional shape simulation is carried out on each of the cells 219 established in the calculation target region 213.

The plurality of cells 219 are established when the calculation target region 213 is divided into portions in predetermined directions (i.e., vertically and horizontally as viewed on the plane of FIG. 6A). Illustratively, the plurality of cells 219 may have the same width each. At their own discretion, users may establish the directions in which to divide the calculation target region 213 (i.e., in which the cells 219 are to be arrayed) and the division width (of each of the cells 219). FIG. 6A shows an example in which the calculation target region 213 is divided in such a manner that two-dimensional simulation is performed on a cross section orthogonal to the direction in which the target pattern 215 extends.

The cross section to be simulated of each cell 219 is illustratively representative of the cell 219 such as the cross section located in the middle of the cell 219. The concept of a plurality of cells may be replaced by the concept of a plurality of cross sections.

The computer constituting the simulation apparatus 1 divides, in step ST2, the calculation target region 213 based primarily on the user-input width of the cell 219 (i.e., to acquire the coordinates of the cell 219 in the array direction). In this case, the computer functions as the cell division module 19.

Figure 7A:
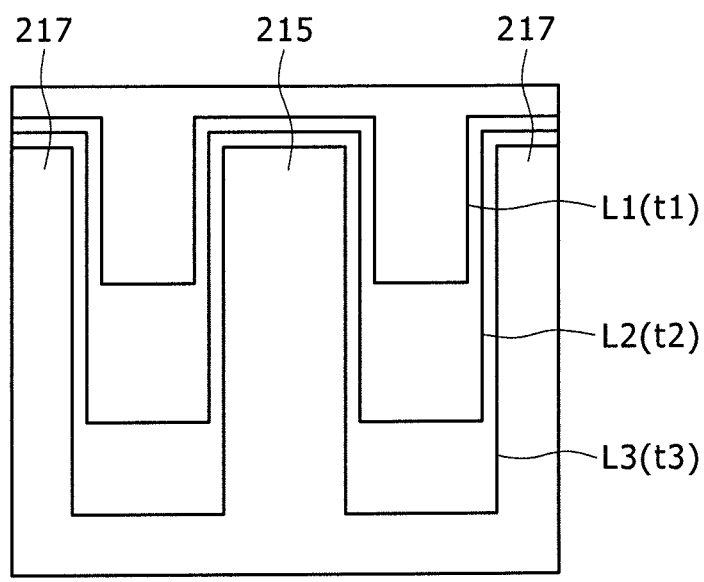
FIGS. 7A and 7B are schematic views explanatory of how simulation calculations are performed in step ST3 of FIG. 4.
Figure 7B:
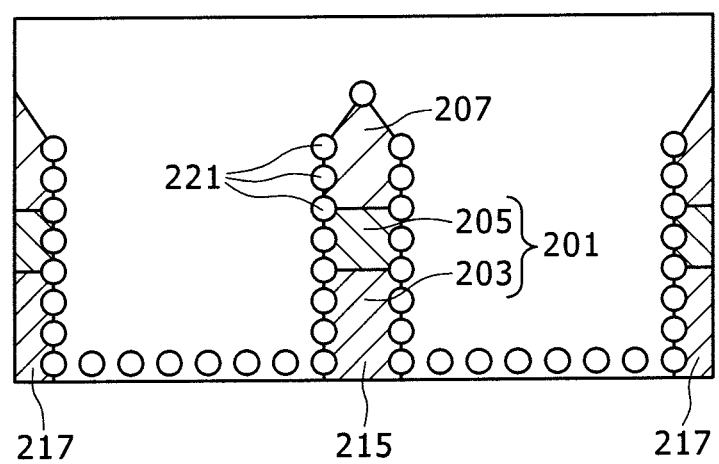

FIGS. 7A and 7B are schematic views explanatory of how simulation calculations are performed in step ST3 of FIG. 4. More specifically, FIG. 7A is a schematic sectional view showing a stage of the simulation of one cell 219. FIG. 7B is a schematic sectional view showing results of the simulation of one cell 219. These cross sections are each shown in a range narrower than that of the cross section of the calculation target region 213 shown in FIG. 5C.

A two-dimensional simulation is implemented illustratively using a known string model. With this type of simulation, as shown in FIG. 7B, the surface shape of the wafer 201 (and mask 207) is represented by a plurality of calculation points (string points) 221. The coordinates of these calculation points 221 are changed through time-evolution calculations based on the etching rate in use. That is, FIG. 7A shows that as time elapses from t1 to t2 to t3, the line connecting the calculation points 221 (i.e., surface of the wafer 201) changes from a solid line L1 to a solid lines L2 to a solid line L3. This is how the two-dimensional simulation is carried out.

When carrying out step ST3, the computer constituting the simulation apparatus 1 functions as the two-dimensional simulation module 25.

Figure 8:
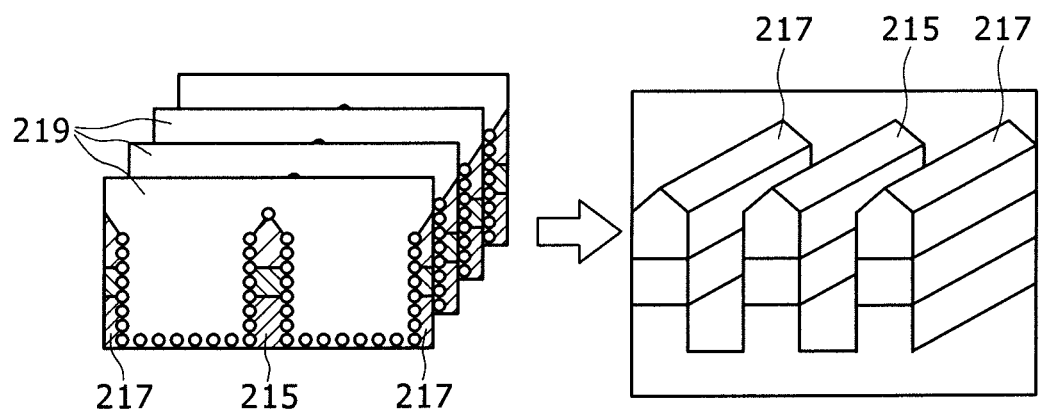
FIG. 8 is a conceptual view explanatory of how three-dimensional modeling is performed in step ST4 of FIG. 4.

FIG. 8 is a conceptual view explanatory of how three-dimensional modeling is performed in step ST4 of FIG. 4.

When the above-described two-dimensional simulation is performed on each of the multiple cells 219, a plurality of sectional shapes of the calculation target region 213 are obtained as shown on the left of FIG. 8.

In step ST4, the computer creates and displays coordinate or image data of a three-dimensional shape based on the coordinate data about the multiple sectional shapes. At this point, the sectional shapes formed between the multiple cross sections having undergone the two-dimensional simulation are calculated using an appropriate interpolation method. Illustratively, the interpolation method may be linear interpolation, Gaussian interpolation, or polynomial interpolation.

When carrying out step ST4, the computer constituting the simulation apparatus 1 functions as the three-dimensional module 27.

(Two-Dimensional Simulation)

In the etching equipment 101, as will be understood from FIG. 1B, the etching rate is affected by the incident flux of the particles 253 entering the wafer 201 through the apertures 207a of the mask 207. The incident flux is influenced not only by the crosswise dimensions of each aperture 207a as viewed on the plane of FIG. 1B but also by the dimensions of the aperture 207a in the vertical and penetrating directions as viewed on the same plane. With this embodiment, the parameters of effective solid angles, wafer aperture ratios, and semilocal aperture ratios are built into the formula for simulation calculations so that the effects of the apertures 207a will be considered in three-dimensional fashion. The details are explained below.

(Effective Solid Angle)

Figure 9:
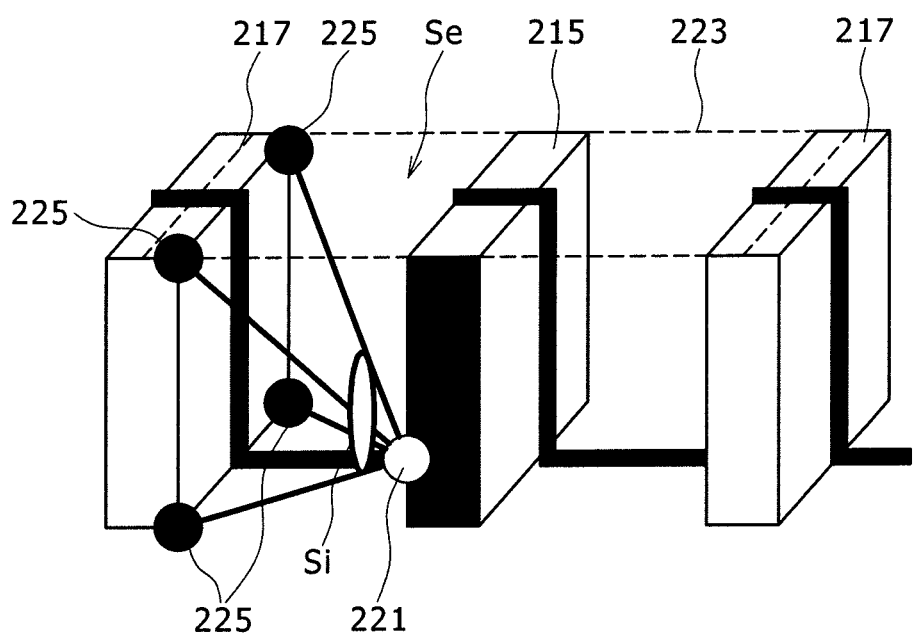
FIG. 9 is a schematic view explanatory of how an effective solid angle is defined and computed.

FIG. 9 is a schematic view explanatory of how an effective solid angle Se is defined and computed.

An effective solid angle Se is a solid angle at which a view can be taken upward (toward where the particles 253 are coming from) from a given calculation point 221 unshielded by the patterns of the mask 207 and wafer 201. In other words, the effective solid angle is a three-dimensional angle at which the particles 253 can directly reach the calculation point 221 from above the mask 207.

To obtain the effective solid angle Se with accuracy would involve taking into account all patterns viewed from the calculation point 221. In practice, however, patterns that are more or less far from the calculation point 221 may be viewed from the calculation point 221 but have relatively limited effects on the incident flux at the calculation point 221. For this reason, what is taken into consideration in calculating the effective solid angle Se is solely the shielding caused by patterns in a relatively narrow (e.g., on the order of several micrometers) local region containing the calculation point 221.

FIGS. 5B, 5C, 6A, and 9 show a typical local region 223. With this embodiment, the local region 223 is established for each of the calculation points 221. In the above-cited figures, the local region 223 is shown corresponding to the calculation point 221 close to the center of the target pattern 215.

The shape and dimensions of the local region 223 may be established as desired. In FIG. 9 and elsewhere, the local region 223 is shown established to be rectangular in shape. The dimensions of the local region 223 may be suitably established in view of the accuracy versus efficiency in calculating the effective solid angle Se. FIG. 5B shows a case where the local region 223 is smaller than the function block 211.

According to the calculations and experiments conducted by the inventors of this invention, when one side (i.e., diameter) of the local region 223 became larger than 2 μm, measures taken to improve accuracy were not very effective. Thus the dimensions of the local region 223 may preferably be established in such a manner that one side (diameter) of the region becomes equal to or smaller than about 2 μm.

With this embodiment, as will be discussed later, the effective solid angle Se is updated based on the surface shape of the wafer 201 being calculated successively in keeping with the progress of the simulation. Thus according to this embodiment, the above-described calculation target region 213 may preferably be established to be wider than the local region 223.

The shape and dimensions of the local region 223 may be either established as desired by the user of the simulation apparatus 1, or set in advance by the manufacturer of the simulation apparatus 1 (i.e., simulation program 15).

The effective solid angle Se may be calculated using a suitable algorithm based on the coordinates of a plurality of calculation points 221 inside the local region 223. Illustratively, as shown in FIG. 9, the four closest points to the adjacent pattern that exists in the local region are acquired first. On the basis of the coordinates of these four points, a predetermined approximate expression (see the above-cited Patent Document 1) is used to calculate a solid angle Si at which a view taken upward from the calculation point 221 of interest is shielded. Then the effective solid angle Se is calculated by subtracting the solid angle Si from $2\pi$.

(Wafer Aperture Ratio)

A wafer aperture ratio is the ratio of the aperture area of the mask 207 to the area of the mask 207 (i.e., covered area plus aperture area). That is, the wafer aperture ratio is the ratio of the aperture area to the wafer 201 as a whole. Since the wafer 201 is made up of a plurality of devices 209 arrayed regularly and having the same structure each, the wafer aperture ratio may be calculated using the aperture ratio of a suitable range covering an appropriate number of devices 209. It should be noted that the aperture ratio of a given device 209 and the wafer aperture ratio are not the same due to the effects of scribing and other factors.

(Semilocal Aperture Ratio)

A semilocal aperture ratio is the ratio of the aperture area of the mask 207 in a given semilocal region to the area of that semilocal region.

FIG. 5B shows a typical semilocal region 227. The semilocal region 227 is established inside the wafer 201 and is narrower than the wafer 201. The semilocal region 227 is wider than the local region 223 and includes that region 223.

What follows is an explanation of the effects of semilocal aperture ratios on processing conversion differences.

Figure 10A:
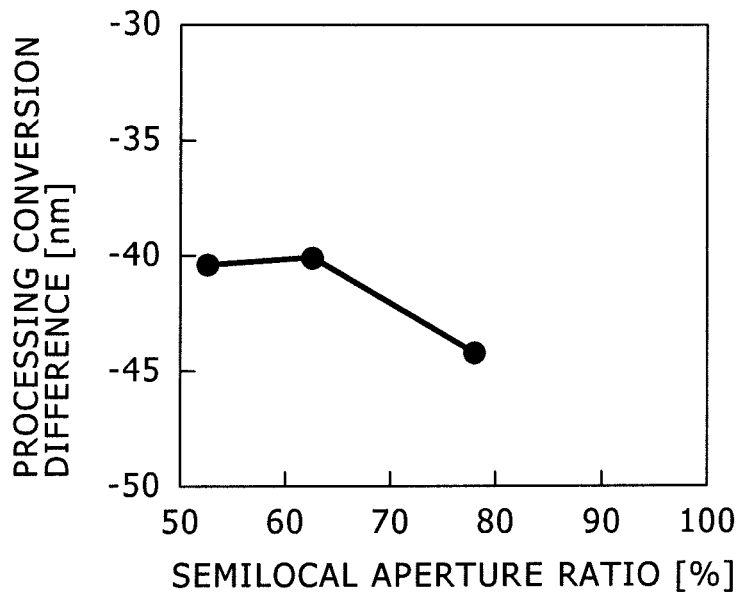
FIGS. 10A and 10B are a graphic representation and a schematic view explanatory of how semilocal aperture ratios affect processing conversion differences.

FIG. 10A is a graphic representation plotting the results of experiments conducted to see how semilocal aperture ratios affect processing conversion differences. In FIG. 10A, the horizontal axis represents semilocal aperture ratios and the vertical axis denotes processing conversion differences.

Figure 10B:
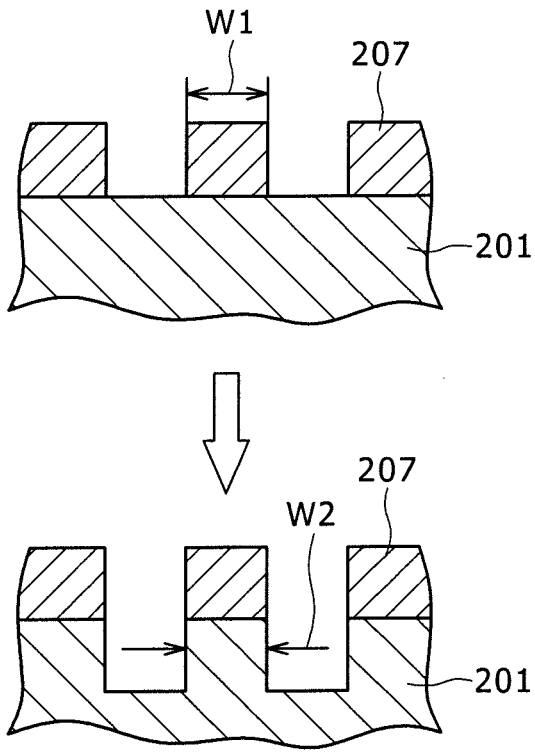

As shown in FIG. 10B, the processing conversion difference is the difference between the pattern width W1 of the mask 207 in effect before the wafer 201 is etched on the one hand, and the pattern width W2 of the wafer 201 having undergone the etching process on the other hand. The values of the processing conversion differences are given a minus sign each because the pattern width W2 of the processed wafer 201 is narrower than the pattern width W1 of the unprocessed mask 207.

According to the above experiments, the radius of the semilocal region 227 was about five times as long (on the order of millimeters) as the mean free path of particle 253 predicted from the process conditions in effect. The effective solid angle Se and the aperture wafer ratio were common to the samples involved.

As shown in FIG. 10A, the processing conversion difference was influenced by the semilocal aperture ratio. Specifically, the processing conversion difference became larger on the positive side as the semilocal aperture ratio became greater, with variations taking place depending on the process conditions. This is because the flux amount of reaction products created from the etched films was dominant over the flux attributable to the mask when the aperture ratio was large (e.g., 70 percent or larger). On the other hand, if the aperture ratio was not large enough (e.g., less than 70 percent), the processing conversion difference became larger on the negative side in response to variations in the semilocal aperture ratio. This is because the flux attributable to the mask became dominant over the reaction products created from the etched films.

Meanwhile, as will be understood from FIG. 5B, where the semilocal region 227 is positioned relative to the device 209 largely determines the function blocks 211 included in the semilocal region 227 and the extent of these inclusions, and varies the semilocal aperture ratio accordingly. In other words, the semilocal aperture ratio is affected by the patterns on the order of millimeters which are not reflected in both the effective solid angle Se under the influence of the patterns on the order of micrometers and the wafer aperture ratio influenced by the patterns on the order of centimeters.

The semilocal aperture ratio thus constitutes a parameter that makes it possible to consider the effects of the patterns of the mask 207 on processing dimensions. These effects cannot be taken into account using the effective solid angle Se and wafer aperture ratio.

The semilocal aperture ratio is established illustratively as follows.

With this embodiment, the semilocal region 227 is established for each calculation point 221. For example, the semilocal region 227 is set to be a circle centering on a plurality of calculation points 221. Alternatively, the semilocal region 227 may be established as a polygon such as a rectangle.

Preferably, the semilocal region 227 should be set to be smaller than a single device 209 (i.e., aperture pattern 207b of the mask 207 corresponding to the device 209). The criterion for determining the difference in size may be the diameter or the area. Illustratively, the semilocal region 227 is established so that its diameter becomes shorter than one side (i.e., diameter) of the device 209. Because one of the sides of the device 209 measures between 20 and 30 mm for this embodiment, the diameter of the semilocal region 227 should preferably be smaller than 20 through 30 mm.

If made progressively larger, the semilocal region 227 would come to include a plurality of devices 209 (aperture patterns 207b). The semilocal aperture ratio would then be approaching the wafer aperture ratio. As a result, the introduction of semilocal aperture ratios would become less relevant. It follows that the semilocal region 227 being smaller than one device 209 provides a rule of thumb for clearly distinguishing the semilocal aperture ratio from the wafer aperture ratio. That is, the semilocal aperture ratio reflects the irregularities inside the device 209.

Experiments conducted by the inventors showed that the diameter of the semilocal region 227 should preferably be about equal to or less than five times as long as the mean free path of plasma 251. The mean free path is typically 1 to several mm long, with some variations depending on the process conditions in effect.

The semilocal region 227 should preferably be established so that its diameter becomes larger than 2 μm. According to the inventors' experiments, as discussed above, once the diameter of the local region 223 exceeds 2 μm, attempts to improve accuracy using the effective solid angle Se turn out to be not very effective. In other words, the diameter in excess of 2 μm makes it difficult to consider the effects of the patterns based on the effective solid angle Se. It is thus preferable to use the semilocal aperture ratio for considering the effects of the patterns where the diameter exceeds 2 μm.

Illustratively, the semilocal region 227 is preferably established so that its radius becomes approximately larger than the mean free path of the plasma 251. As long as the radius is longer than the mean free path, a plurality of particles 253 collide with one another and affect one another when entering the wafer 201. With the radius kept greater than the mean free path, attempts to consider the effects of the aperture pattern 207b using the effective solid angle Se are thus predicted to be difficult to accomplish. When the radius is in such a range, the effects of the aperture pattern 207b should preferably be taken into account using the semilocal aperture ratio.

(Map Data)

FIG. 11A is a conceptual view listing typical map data of the effective solid angle Se. FIG. 11B is a conceptual view listing typical map data of the semilocal aperture ratio.

With this embodiment, as described above, the calculation target region 213 is divided into a plurality of cells 219. A plurality of calculation points 221 are established for each of the cells 219. The effective solid angle Se and the semilocal aperture ratio are calculated per calculation point 221. When the map data such as those indicated in FIGS. 11A and 11B are created and referenced, it becomes easier to perform the calculations involved.

(Operation Expressions)

The effective solid angle Se, wafer aperture ratio Rw, and semilocal aperture ratio Rs are built into the operation expressions for simulation as described below.

For the two-dimensional simulation of this embodiment, an incident flux Γ is calculated using predetermined arithmetic expressions. An etching rate ER is then computed based on the incident flux Γ. On the basis of the etching rate ER, the coordinates of the calculation point 221 are moved as explained above in reference to FIGS. 7A and 7B.

The calculation of the incident flux Γ, the calculation of the etching rate ER, and the movement of the calculation point 221 are carried out in a single calculation time step. The simulation is advanced in predetermined time increments by repeatedly carrying out the calculation time step.

The effective solid angle Se, wafer aperture ratio Rw, and semilocal aperture ratio Rs are utilized as the parameters to be used in the expressions for calculating the incident flux Γ. Illustratively, the incident flux Γ is computed using the following expressions:

$$\Gamma = \Gamma w + \Gamma s$$

$$\Gamma w = (1-D) \times Rw \times ER \times \rho \times Se + (1-Dm) \times (1-Rw) \times ERm \times \rho m \times Se$$

$$\Gamma s = (1-D) \times Rs \times ER \times \rho \times Se + (1-Dm) \times (1-Rs) \times ERm \times \rho m \times Se$$

where, the first term on the right of the expressions of Γw and Γs is attributed to the etched films and the second term to the mask. Reference characters D and Dm each denote the dissociation fraction of the reaction products 257, and ρ and ρm represent the density of the etched films and mask film. In the above expressions, the values of ER and ERm are values in effect in the immediately preceding calculation time step. The value ERm is defined as a value obtained by multiplying the value ER by the mask selectivity. In this specification, references to both ER and ERm may be represented by an indication of ER alone, with the reference to ERm omitted where appropriate. The same also applies to D and Dm.

ER×ρ corresponds to the amount of the reaction products 257 generated in the immediately preceding calculation time step. Multiplying ER×ρ by (1−D) provides the amount of the reaction products which, when redeposited, can contribute to the etching process. This amount is tempered with the influence of the wafer aperture ratio Rw and semilocal aperture ratio Rs, whereby the incident flux Γ is calculated.

More specifically, the effects of the effective solid angle Se are taken into account in such a manner that the incident flux Γ becomes proportional to the effective solid angle Se. Also, the effects of the wafer aperture ratio Rw and semilocal aperture ratio Rs are taken into consideration so that that portion of the incident flux Γ attributable to the etched films becomes proportional to the sum of the wafer aperture ratio Rw and semilocal aperture ratio Rs. Furthermore, the effects of the wafer aperture ratio Rw and semilocal aperture ratio Rs are considered in such a manner that that portion of the incident flux Γ attributable to the mask becomes proportional to the sum of (1−Rw) and (1−Rs).

Theoretically, the above expressions are utilized, the wafer aperture ratio Rw is more accurate in definition if defined as the aperture ratio of the entire wafer 201 minus the semilocal region 227 rather than as the aperture ratio of the wafer 201 as a whole. In practice, however, the semilocal region 227 is sufficiently narrow compared with the entire area of the wafer 201, so that the wafer aperture ratio Rw can be defined as the aperture ratio of the water 201 as a whole with no problem. Under these circumstances, the wafer aperture ratio mentioned in this specification is understood also to include the aperture ratio of the region of the entire area of the wafer 201 minus the semilocal region 227.

The operation expressions for calculating the etching rate ER based on the incident flux Γ may be any appropriate known expressions such as those disclosed in "The basics and the latest applications of implementing a practical plasma process," a textbook (in Japanese) by Koichi Ono for the 16th Plasma Electronics Lecture Class; published on Oct. 27, 2005, by the Division of Plasma Electronics, The Japan Society of Applied Physics.

The expressions for moving the calculation point 221 based on the etching rate ER may also be any known expressions suitable for the purpose.

Figure 12:
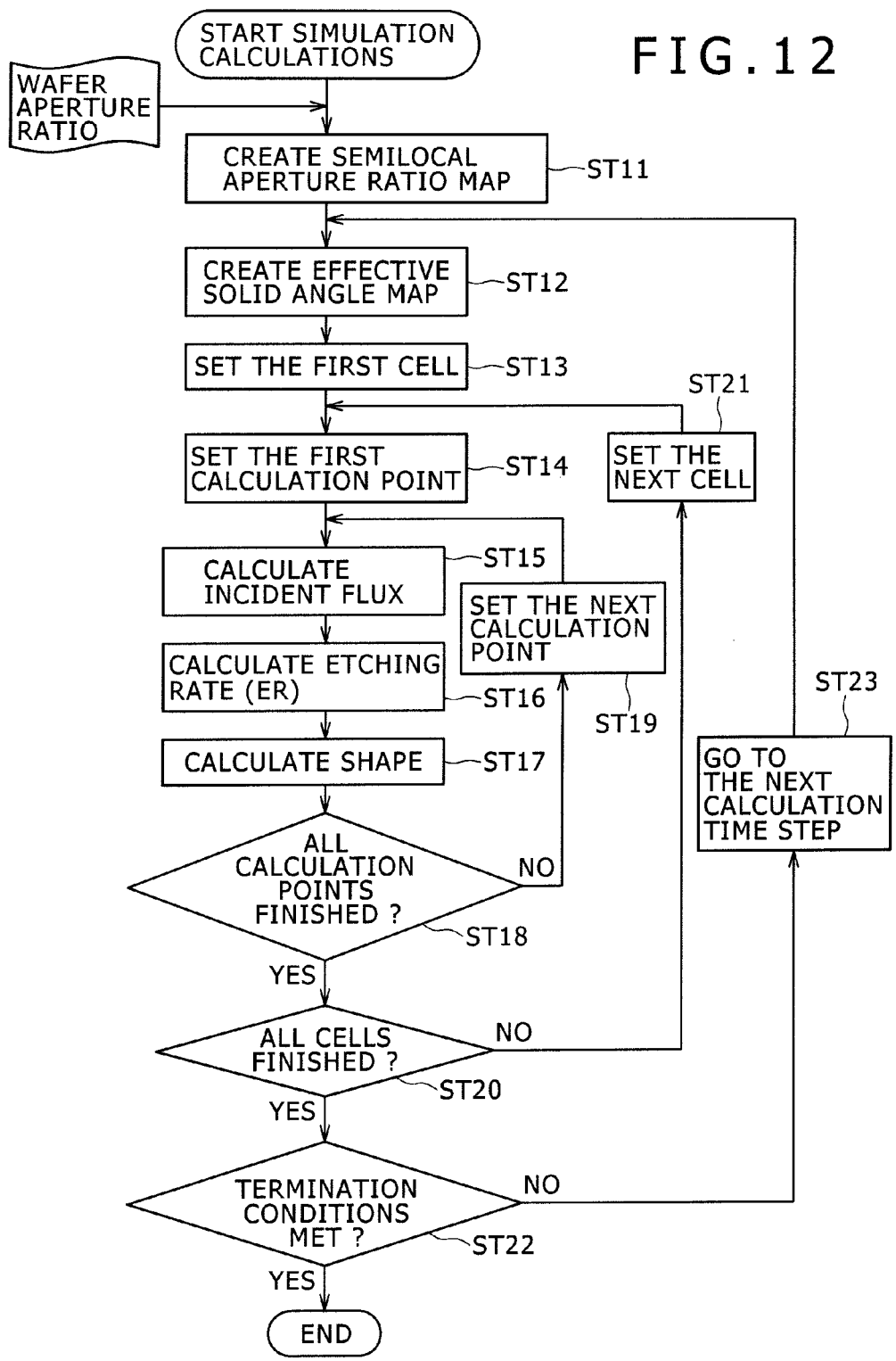
FIG. 12 is a flowchart showing details of step ST3 in FIG. 4.

FIG. 12 is a flowchart showing a typical procedure executed by the CPU 3 for carrying out the above-described simulation calculations (i.e., step ST3 in FIG. 4).

It is assumed that the wafer aperture ratio Rw is acquired beforehand and that this value is used throughout the simulation calculations.

In step ST11, the CPU 3 creates map data of the semilocal aperture ratio Rs as shown in FIG. 11B, and stores the created data into the RAM 7 or the external storage device 9.

In step ST12, the CPU 3 creates map data of the effective solid angle Se as indicated in FIG. 11A, and stores the created data into the RAM 7 or the external storage device 9.

In step ST13, the CPU 3 sets the first cell 219 in a predetermined sequence of the cells 219 as the target to be calculated. The sequence of the cells 219 may be determined appropriately by the CPU 3 or by the user.

In step ST14, the CPU 3 sets the first calculation point 221 in a predetermined sequence of a plurality of calculation points 221 with regard to the cell 219 being established as the calculation target. The sequence of the calculation points 221 may be determined suitably by the CPU 3 or by the user.

In step ST15, the CPU 3 calculates the incident flux Γ relative to the calculation point 221 as the calculation target using the above-described operation expressions. In the first calculation time step, the value of the immediately preceding etching rate ER is obtained on the assumption that the incident flux Γ (of reaction products) is 0. The effective solid angle Se and semilocal aperture ratio Rs are acquired by referencing the map data created in steps ST11 and ST12.

In step ST16, the CPU 3 calculates the etching rate ER based on the incident flux Γ calculated in step ST15.

In step ST17, the CPU 3 varies the coordinates of the calculation point 221 based on the etching rate ER calculated in step ST16. That is, the CPU 3 computes the surface shape of the wafer 201.

In step ST18, the CPU 3 checks to determine whether all calculation points 221 in the cell 219 as the calculation target are finished with the calculations. If all calculation points 221 are not found to be finished yet, then the CPU 3 goes to step ST19 and sets the next calculation point 221 in the predetermined sequence as the target to be calculated, before returning to step ST15. If all calculation points 221 in the cell 219 are found to be finished with the calculations, then the CPU 3 goes to step ST20.

In step ST20, the CPU 3 checks to determine whether all cells 219 are finished with the calculations. If all cells 219 are not found to be finished yet, then the CPU 3 goes to step ST21 and sets the next cell 219 in the predetermined sequence, before returning to step ST14. If all cells 219 are found to be finished with the calculations, then the CPU 3 goes to step ST22.

In step ST22, the CPU 3 checks to determine whether predetermined termination conditions are met. The termination conditions typically consist in whether a predetermined time period has elapsed (i.e., if the calculation time step has been repeated a predetermined number of times) and whether the calculation point 221 has reached a predetermined location (i.e., if a predetermined amount has been etched).

If in step ST22 the termination conditions are not found to be met, then the CPU 3 goes to step ST23 and makes preparations for the calculations of the next calculation time step, before returning to step ST12. The preparations for the next calculation time step illustratively include setting up the etching rate ER of the current calculation time step as the etching rate ER of the preceding calculation time step. If in step ST22 the termination conditions are found to be met, then the CPU 3 terminates the procedure.

When executing steps ST11 and ST12, the CPU 3 functions as the semilocal aperture ratio map creation module 23 and solid angle map creation module 21, respectively. And when executing steps ST15, ST16, and ST17, the CPU 3 functions as the flux computation block 29, ER computation block 31, and shape computation block 33, respectively.

The procedure in FIG. 12 is only an example and may be changed as needed. For example, the map data of the effective solid angle Se may not be created in step ST12. Instead, the effective solid angle Se may be computed with regard to the calculation point 221 as the calculation target in a loop constituted by steps ST15 through ST19. The loops of steps ST19 and ST21 may be provided alternatively for calculating the incident flux Γ (in step ST15), for calculating the etching rate ER (in step ST16), and for calculating the shape (in step ST17). In other words, the map data of the incident flux Γ and the other factors may be created.

According to the above-described embodiment of the invention, the simulation apparatus 1 has the flux computation block 29 that calculates the incident flux Γ of the particles 253 with regard to each calculation point 221 established on the surface of the wafer 201. The simulation apparatus 1 also has the shape computation block 33 that time-evolves the coordinates of a plurality of calculation points 221 based on the calculated incident flux Γ so as to compute the surface shape of the wafer 201. The flux computation block 29 computes the incident flux Γ per calculation point 221 based on the effective solid angle Se, wafer aperture ratio Rw, and semilocal aperture ratio Rs. The effective solid angle Se is a solid angle at which a view taken from a given calculation point 221 is left unshielded by the patterns of the local region 223 including the calculation point 221 in question. The wafer aperture ratio Rw is the ratio of the aperture area of the mask 207 to the area of the mask 207 covering the wafer 201. The semilocal aperture ratio Rs is the ratio of the aperture area of the mask 207 in a given semilocal region 227 of interest to the area of the semilocal region 227 of interest which includes the local region 223 and which is narrower than the wafer 201.

That is, this embodiment of the invention introduces range parameters that can affect the processing shape constituted by the semilocal region 227, thereby acquiring a semilocal aperture ratio map. This aperture ratio map is used as a parameter affecting the incident flux Γ. That in turn makes it possible to temper the simulation with the effects of the difference between pattern structures on the chip level; these effects were heretofore not taken into consideration using the effective solid angle Se and wafer aperture ratio Rw only. It is possible to predict the distribution of processed shapes in a three-dimensional space on the chip and wafer region levels. This renders the simulation more accurate than traditional prediction methods.

The flux computation block 29 computes the incident flux Γ using the operation expressions defined in such a manner that the incident flux Γ will become proportional to the effective solid angle Se as well as to the sum of the wafer aperture ratio Rw and semilocal aperture ratio Rs. This is a simplified way to temper the simulation with the effects of the effective solid angle Se, wafer aperture ratio Rw, and semilocal aperture ratio Rs.

The local region 223 and semilocal region 227 are established in a manner centering on each of the calculation points 221 involved. The accuracy of the simulation is enhanced because the effective solid angle Se and semilocal aperture ratio Rs are calculated per calculation point 221.

The simulation apparatus 1 has the semilocal aperture ratio map creation module 23 that stores a plurality of calculation points 221 in association with a plurality of semilocal aperture ratios Rs each computed per calculation point 221 into the storage block (e.g., RAM 7). The flux computation block 29 computes the incident flux Γ by referencing the plurality of semilocal aperture ratios Rs held in the storage block. Since the semilocal aperture ratio Rs is calculated only once per calculation point 221, the computing speed of simulation is boosted.

2. Second Embodiment

The structure of the simulation apparatus implemented as the second embodiment of the invention is substantially the same as that of the simulation apparatus 1 constituting the first embodiment, including the CPU 3 and the other components shown in FIG. 2. That is, the simulation apparatus as the second embodiment differs from the first embodiment only in terms of operations.

When looked at differently, the workings of the simulation apparatus as the second embodiment may be considered to take place in an operation mode different from the mode in which the simulation apparatus as the first embodiment operates.

Figure 13A:
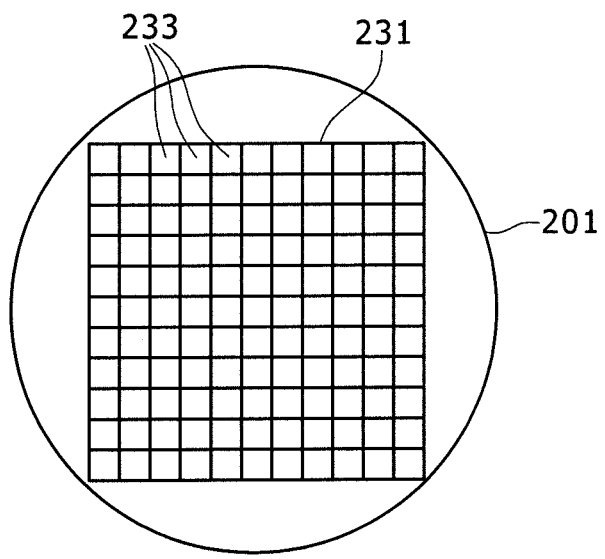
FIGS. 13A and 13B are schematic views explanatory of how a simulation apparatus implemented as a second embodiment of the present invention operates.
Figure 13B:
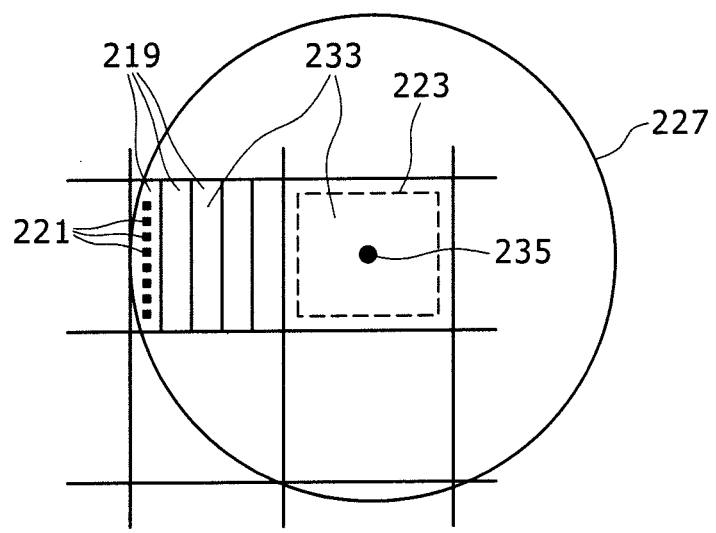

FIGS. 13A and 13B are schematic views explanatory of how the simulation apparatus implemented as the second embodiment of the present invention operates. More specifically, FIG. 13A is a schematic plan view of the wafer 201, and FIG. 13B is a partially enlarged view of a part of what is shown in FIG. 13A.

In about the same manner as the simulation apparatus 1 of the first embodiment, the simulation apparatus of the second embodiment performs simulations by computing the incident flux Γ based on the effective solid angle Se, wafer aperture ratio Rw, and semilocal aperture ratio Rs.

It should be noted that the simulation apparatus of the second embodiment divides the calculation target region 231 into a plurality of meshes 233 as shown in FIG. 13A so that the simulation will be performed per mesh 233.

The calculation target region 231 is established as a relatively extensive region. Illustratively, the calculation target region 231 is set wide enough to cover a plurality of devices 209 or just about the entire surface of the wafer 201.

Typically, the calculation target region 231 is set automatically to cover the entire surface of the wafer 201 by the simulation apparatus. Alternatively, the calculation target region 231 may be established as desired by the user, as in the case of the first embodiment.

The shape and dimensions of the mesh 233 are suitably determined by the manufacturer of the simulation apparatus or by the user. FIG. 13A shows an example in which the mesh 233 is set to be rectangular in shape. Illustratively, the mesh 233 is set to be smaller in size than the device 209 of the wafer 201, with each of the sides of the mesh measuring between hundreds of nanometers (nm) and several micrometers (μm).

The mesh 233 corresponds to the calculation target region 213 for the first embodiment. That is, as shown at the top left of FIG. 13B, the mesh 233 is divided into a plurality of cells 219 each having a plurality of calculation points 221 established therein. A two-dimensional simulation is then carried out on the mesh 233. Alternatively, without being divided into a plurality of cells 219, the mesh 233 may have its representative cross section alone (e.g., its central cross section) submitted to the two-dimensional simulation.

As opposed to its counterpart of the first embodiment, the simulation apparatus of the second embodiment utilizes approximately calculated effective solid angles Se and wafer aperture ratios Rw. The details are as follows:

For the first embodiment, the local region 223 is established per calculation point 221. The effective solid angle Se is a solid angle at which a view is taken upward from each of the plurality of calculation points 221. For the second embodiment, by contrast, the local region 223 is set in common to a plurality of calculation points 221 belonging to each mesh 233. That is, the local region 223 is established per mesh 233. The effective solid angle Se is established likewise for each mesh 233.

More specifically, as shown in the mesh 233 at the top right of FIG. 13B, the local region 223 is established in a manner centering on a center point 235 of the mesh 233. The effective solid angle Se is a solid angle at which a view taken upward from the center point 235 is left unshielded by the patterns in the local region 223. The suitable dimensions of the local region 223 are substantially the same as those for the first embodiment.

Like the effective solid angle Se, the semilocal region 227 is established per mesh 233. More specifically, as shown in the mesh 233 at the top right of FIG. 13B, the semilocal region 227 is set in a manner centering on the center point 235 of the mesh 233. The suitable dimensions of the semilocal region 227 are substantially the same as those for the first embodiment.

For the first embodiment, the effective solid angle Se is calculated based on the successively computed shapes. In other words, the effective solid angle Se is updated per calculation time step. For the second embodiment, by contrast, the effective solid angle Se is calculated beforehand based on the patterns and film thickness of the mask 207 as well as on the film thickness of the etched films. The effective solid angle Se thus calculated is utilized throughout the process. The depth of the etched films at the center point 235 for calculating the effective solid angle Se is selected from among the depths reached in the unprocessed state through the processed state. The pattern shape to be used is an approximation of the shape to be formed by etching.

Figure 14:
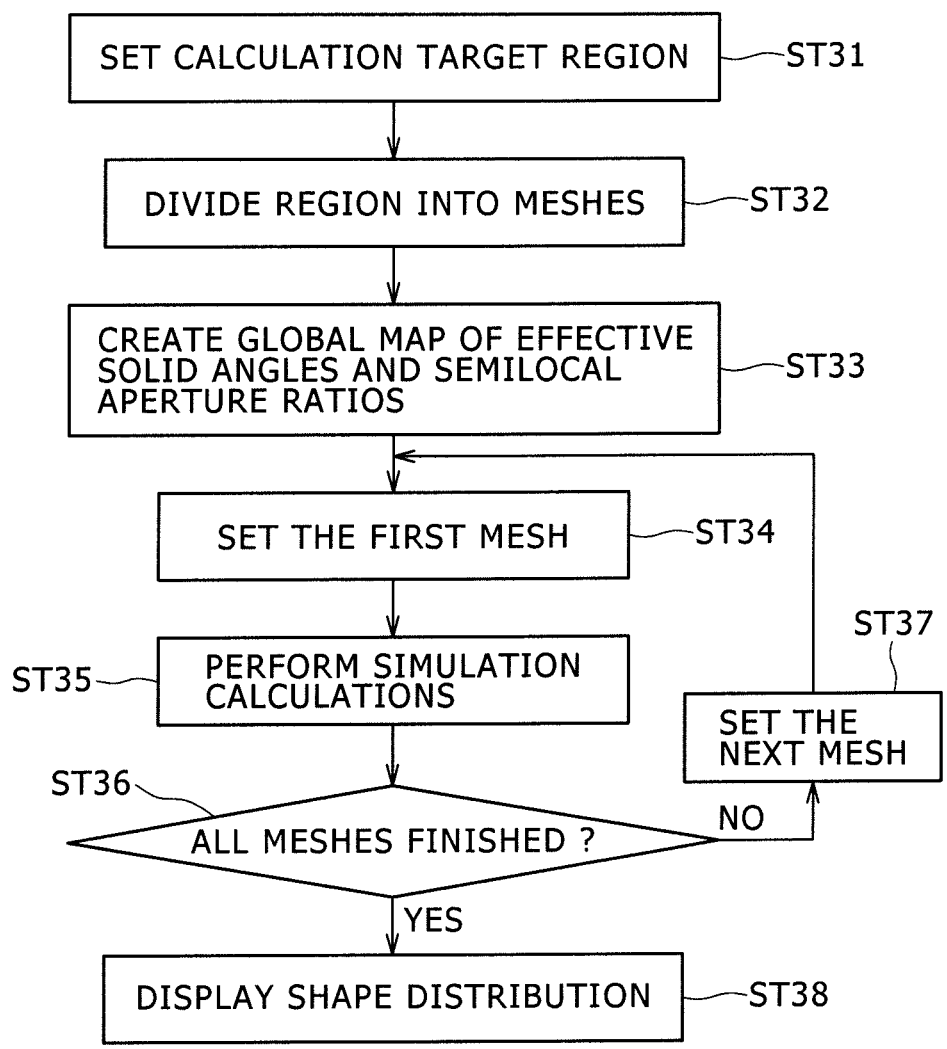
FIG. 14 is a flowchart outlining the procedure executed by the simulation apparatus as the second embodiment.

FIG. 14 is a flowchart outlining the procedure executed by the CPU 3 of the simulation apparatus as the second embodiment.

In step ST31, the CPU 3 establishes the calculation target region 231 based typically on the user's input to the input block 11.

In step ST32, the CPU 3 divides the calculation target region 213 into a plurality of meshes having a predetermined size and shape each, typically on the basis of the user's input to the input block 11.

In step ST33, the CPU 3 calculates the effective solid angle Se and semilocal aperture ratio Rs in reference to the center point 235 regarding each mesh 233, as discussed above. The storage block (e.g., RAM 7) accommodates the map data constituted by the calculated effective solid angles Se and semilocal aperture ratios Rs. The map data corresponds to the mesh 233 and is more global in nature than the data shown in FIGS. 11A and 11B.

In step ST34, the CPU 3 sets the first mesh 233 in a predetermined sequence of the meshes 233 as the calculation target. The sequence of the meshes 233 may be determined suitably by the CPU 3 or by the user.

In step ST35, the CPU 3 performs a two-dimensional simulation inside the mesh 233 established as the calculation target. The two-dimensional simulation may illustratively be that of the flowchart in FIG. 12 minus steps ST11 and ST12. As mentioned above, the effective solid angle Se and semilocal aperture ratio Rs are obtained by referencing the storage block (e.g., RAM 7) and are common to the plurality of calculation points 221 inside the mesh 233.

In step ST36, the CPU 3 checks to determine whether all meshes 233 are finished with the calculations. If all meshes 233 are not found to be finished yet, then the CPU 3 goes to step ST37 and establishes the next mesh 233 as the calculation target in the predetermined sequence of the meshes 233, before returning to step ST35. If in step ST36 all meshes are found to be finished with the calculations, then the CPU 3 goes to step ST38.

In step ST38, the CPU 3 displays a shape distribution. Illustratively, the CPU 3 computes evaluation indexes for each mesh 233 and displays them illustratively in a three-dimensional graphic representation. Typical evaluation indexes include CD (critical dimension), taper angle, and LER (line edge roughness).

According to the above-described second embodiment, as with the first embodiment, the effects of the effective solid angle Se, wafer aperture ratio Rw, and semilocal aperture ratio Rs are reflected in the results of the simulation, whereby the accuracy of the simulation is enhanced appreciably.

3. Third Embodiment

Figure 15:
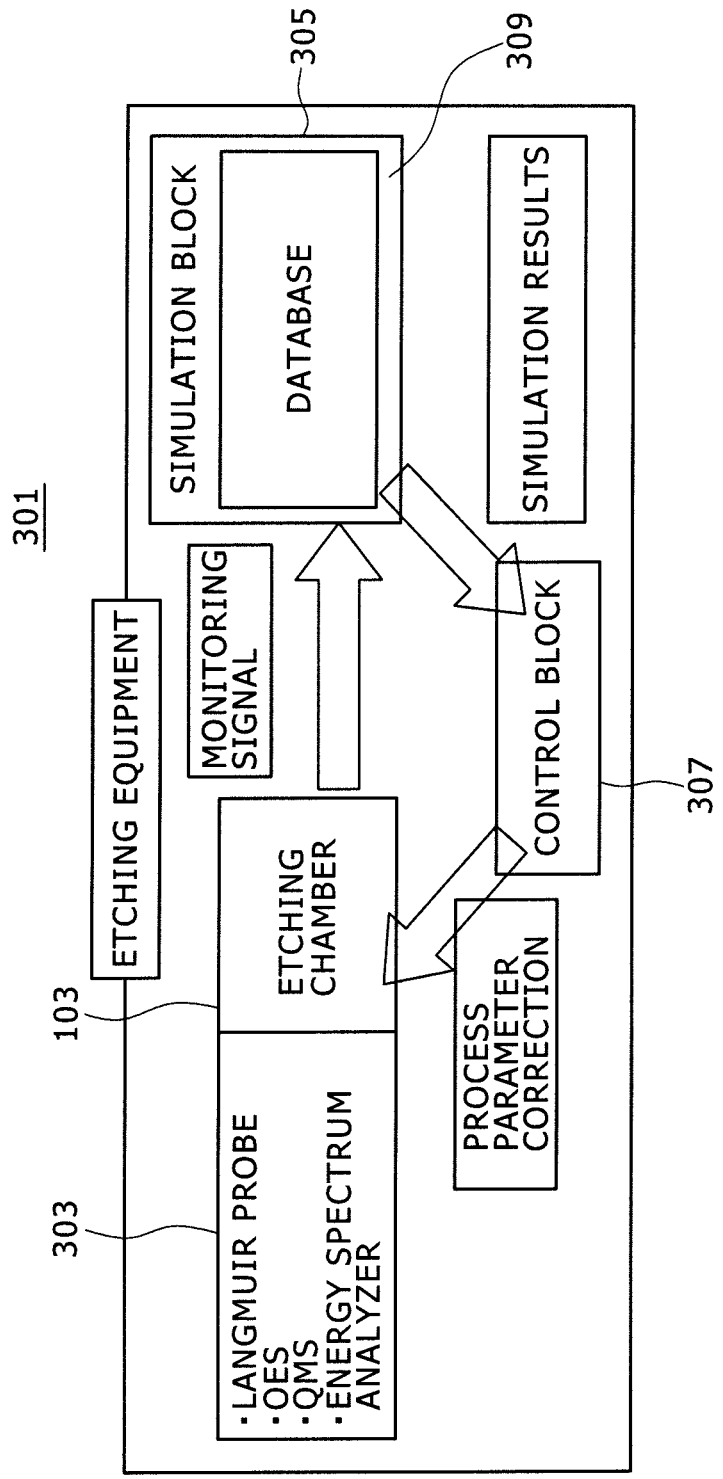
FIG. 15 is a block diagram outlining a typical structure of etching equipment implemented as a third embodiment of the present invention.

FIG. 15 is a block diagram outlining a typical structure of etching equipment 301 implemented as the third embodiment of the present invention.

The etching equipment 301 has components such as the chamber 103 shown in FIG. 1A, and a detection section 303 that detects physical quantities related to the etching process in the chamber 103. The etching equipment 301 also has a simulation section 305 structured to include the simulation apparatus explained above in conjunction with the first or the second embodiment. Furthermore, the etching equipment 301 has a control section 307 that controls the etching process in the chamber 103.

Illustratively, the detection section 303 includes at least a Langmuir probe, an OES (optical emission spectrometer), a QMS (quadruple mass spectrometer), or an ion energy spectrum analyzer.

The simulation section 305 is composed of a computer as with the simulation apparatus explained above in conjunction with the first or the second embodiment. The computer may be either incorporated in the equipment containing the chamber 103 and other components or connected to the equipment via a network.

The control section 307 is illustratively formed by a computer. The computer constituting the control section 307 may be the same computer making up the simulation section 305 or may be another computer.

Figure 16:
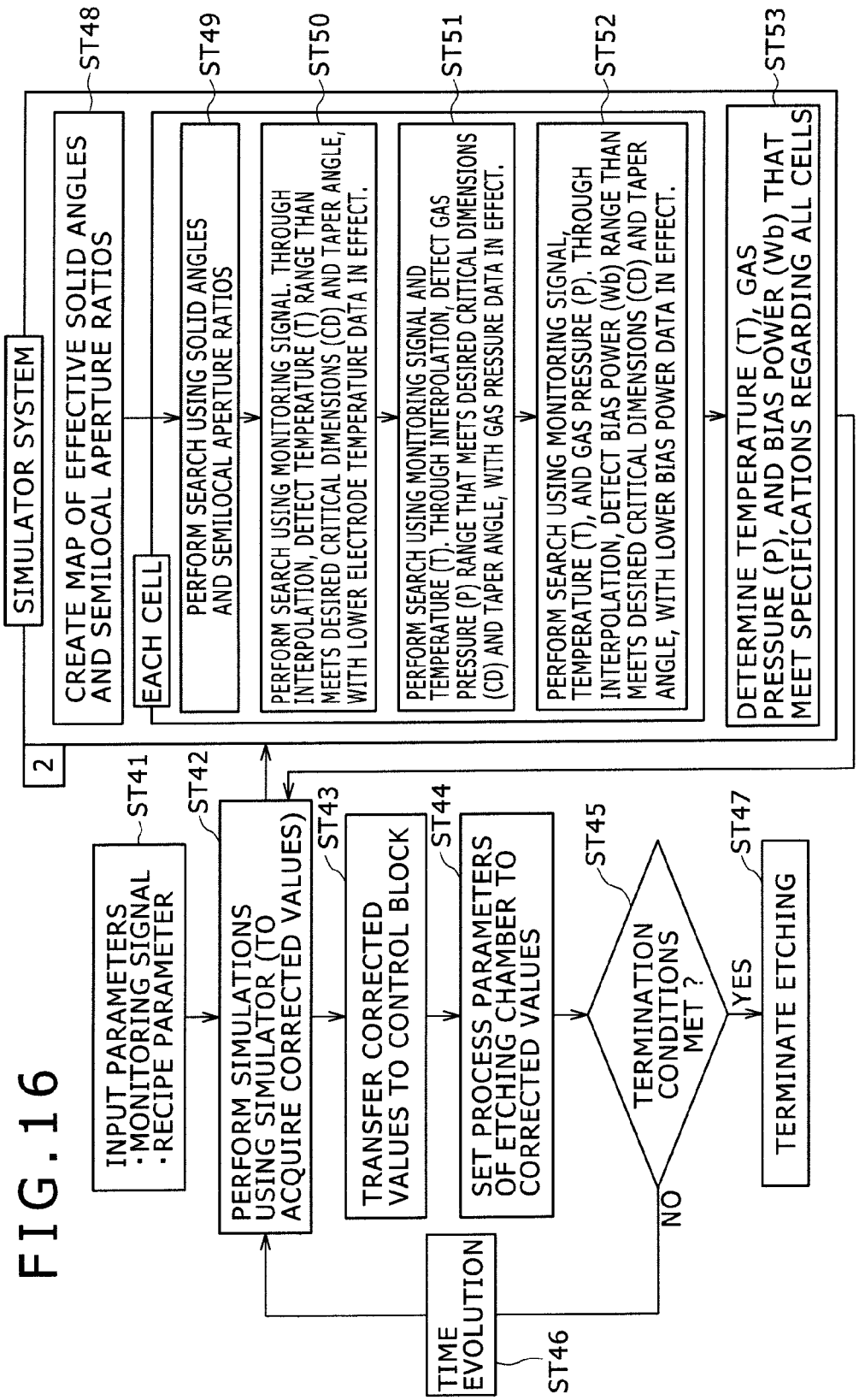
FIG. 16 is a flowchart showing a process parameter correction procedure executed by the etching equipment in FIG. 15.

FIG. 16 is a flowchart showing a process parameter correction procedure executed by the etching equipment 301.

In step ST41, the detection section 303 monitors a plasma gas phase (e.g., for electron density, electron temperature, luminescence intensity, ion-atom-molecule type, ion energy) at suitable intervals during etching, and signals the results to the simulation section 305. Besides the monitoring signal received from the detection section 303, the simulation section 305 has recipe parameters input therein beforehand.

In step ST42, based on the signal from the detection section 303, the simulation section 305 acquires corrected values of the process parameters for use by the chamber 103. Step ST42 will be discussed later in more detail.

In step ST43, the simulation section 305 transfers the corrected values thus acquired to the control section 307.

In step ST44, the control section 307 establishes the corrected values as new process parameters. The control section 307 proceeds to control the power supply device 107 and other components in such a manner that the etching process will take place in accordance with the newly established process parameters.

In step ST45, the control section 307 checks to determine whether the termination conditions of etching are met. If the termination conditions are not found to be met, the control section 307 returns to step ST42. The time elapses while steps ST42 through ST45 are being repeated (see step ST46). If the termination conditions are found to be met, the control section 307 goes to step ST47 and terminates the etching process.

The corrected values are acquired in step ST42 as follows.

Prior to etching, the simulation section 305 carries out the simulation explained above in conjunction with the first and the second embodiments by varying diverse parameters making up simulation conditions. The simulation section 305 then forms a database 309 of simulation results regarding a plurality of simulation cases.

The parameters constituting the simulation conditions illustratively include film thickness, PR width, plasma gas phase, process parameters, wafer aperture ratio, semilocal aperture ratio, and effective solid angle. The process parameters illustratively include gas pressure, gas type, flow rate, bias power, and lower electrode temperature.

Illustratively, the wafer aperture ratio and semilocal aperture ratio may each be varied in suitable increments of 0 through 100 percent (0.1 through 1.0). The effective solid angle may be varied in appropriate increments of 0 through $2\pi$.

The database 309 stores the values of the diverse parameters defining the simulation conditions in association with the simulation results obtained by using these values. Illustratively, parameters such as CD (critical dimensions) and taper angle may be stored as the simulation results. Alternatively, the coordinates of the calculation points 221 may be included in the database 309 as the simulation results.

The database 309 is structured in such a manner as to permit searches for the values of CD and taper angle using as search keys the values of the various parameters defining the simulation conditions. The diverse parameters defining the simulation conditions include at least part of the parameters contained in the monitoring signal coming from the detection section 303. That is, the database 309 is structured to permit searches based on the parameter values included in the monitoring signal as the search key.

If a parameter value input as a search key falls between parameter values stored in the database 309, the corresponding simulation result is acquired through interpolation calculations.

In step ST48 of FIG. 16, the simulation section 305 creates a map of the effective solid angle Se and semilocal aperture ratio Rs regarding the wafer 201 being etched.

As with the second embodiment, the effective solid angle Se and semilocal aperture ratio Rs are used unchanged throughout the process regardless of time evolution. The effective solid angle Se and semilocal aperture ratio Rs are calculated based illustratively on previously input aperture patterns and film thickness values of the mask 207. Alternatively, these parameters may be computed in a manner tempered with the progress of etching. For example, the effective solid angle Se may be reduced by a suitable rate in keeping with the progress of etching.

The effective solid angle Se and semilocal aperture ratio Rs are typically detected as representative values of each cell 219, as in the case where the representative values of the mesh 233 are computed by the second embodiment. The map is then created in units of a cell 219. Alternatively, the map may be created in units of a narrower or a wider region than the cell 219.

Steps ST49 through ST52 are carried out with regard to each of a plurality of cells 219.

In step ST49, the simulation section 305 searches the database 309 for at least one simulation case using the effective solid angle Se and semilocal aperture ratio Rs as the search key.

After detecting the simulation cases using the effective solid angle Se and semilocal aperture ratio Rs as the search key, the simulation section 305 refines the search results using the parameter values contained in the monitoring signal coming from the detection section 303.

The simulation section 305 then checks to determine whether the CD and taper angle isolated by the search fall within specification values. Typically, the specification values are defined to be between −10 to 10 percent of the required dimensions.

If the isolated dimensions are determined to fall within the specification values, that means there is no need to correct the process parameters. In that case, steps ST50 through ST52 are skipped. If the same determination is made for all cells 219, then the simulation section 305 returns the parameter values contained in the current monitoring signal to the control section 307.

If the isolated dimensions are determined to be outside the specification values, the simulation section 305 goes to step ST50.

In step ST50, from the diverse parameter values included in the monitoring signal, the simulation section 305 selects the value of the lower electrode temperature T and replaces it with a variety of values. The simulation section 305 makes another search through the database 309 using the diverse parameters values having undergone the replacement.

At this point, the value of the lower electrode temperature T following the replacement is limited to a predetermined indexing range of variations. For example, the value subsequent to the replacement is set to fall between −50 and +50 percent of the value of the lower electrode temperature T included in the monitoring signal.

After making the search following the replacement, the simulation section 305 compares the isolated CD and other dimensions with the corresponding specification values. This enables the simulation section 305 to determine the (optimal) value of the lower electrode temperature T that optimizes the CD and other dimensions within the above-mentioned indexing range.

If the CD and other dimensions are determined to fall within the specification values with the optimal value of the lower electrode temperature T in effect, then steps ST51 and ST52 are skipped. If the CD and the rest are not found to fall within the specification values using the optimal value, then the simulation section 305 goes to step ST51.

In step ST51, the simulation section 305 performs the same process about the gas pressure P as that carried out in step ST50 to obtain the optimal value of the lower electrode temperature T, thereby acquiring an optimal value or a tolerable range of variations of the gas pressure P. As opposed to step ST50 in which the value of the lower electrode temperature T is varied in the monitoring signal, step ST51 involves varying the value of the gas pressure P in the monitoring signal following the replacement of the value of the lower electrode temperature T with its optimal value.

If the CD and other dimensions are determined to fall within the specification values with the optimal value in effect, step ST52 is skipped. If the CD and the rest are not found to fall within the specification values using the optimal value, the simulation section 305 goes to step ST52.

In step ST52, as in step ST51, an optimal value or a tolerable range of variations is obtained of the bias power Wb based on the monitoring signal in which the lower electrode temperature T and gas pressure P have been replaced with their optimal values.

By repeating steps ST50 and ST51 on all cells 219, it is possible to obtain the lower electrode temperature T, gas pressure P, and bias power Wb that allow the CD and other dimensions to meet the specification values regarding all cells 219 (in step ST53). The values thus acquired are transferred to the control section 307.

In the foregoing paragraphs, the parameters to be corrected were shown to be the lower electrode temperature, gas pressure, and bias power. Alternatively, the parameters subject to correction may be the flow rate of gas and top power.

According to the third embodiment described above, the distributions of solid angles Se, wafer aperture ratios Rw, and semilocal aperture ratios Rs are used as the basis for performing highly accurate simulations that take the effects of the differences in structure on the chip or wafer level into consideration. The etching process can be corrected in real time using such simulations. This enables the processing of high precision to be implemented at low cost.

4. Fourth Embodiment

With the third embodiment, simulations are carried out prior to etching and the database 309 is set up to retain the simulation results. With the fourth embodiment, by contrast, simulations are performed in real time during etching. The structure of the etching equipment as the fourth embodiment is the same as the equipment structure shown in FIG. 15, except that the database 309 is not provided.

Figure 17:
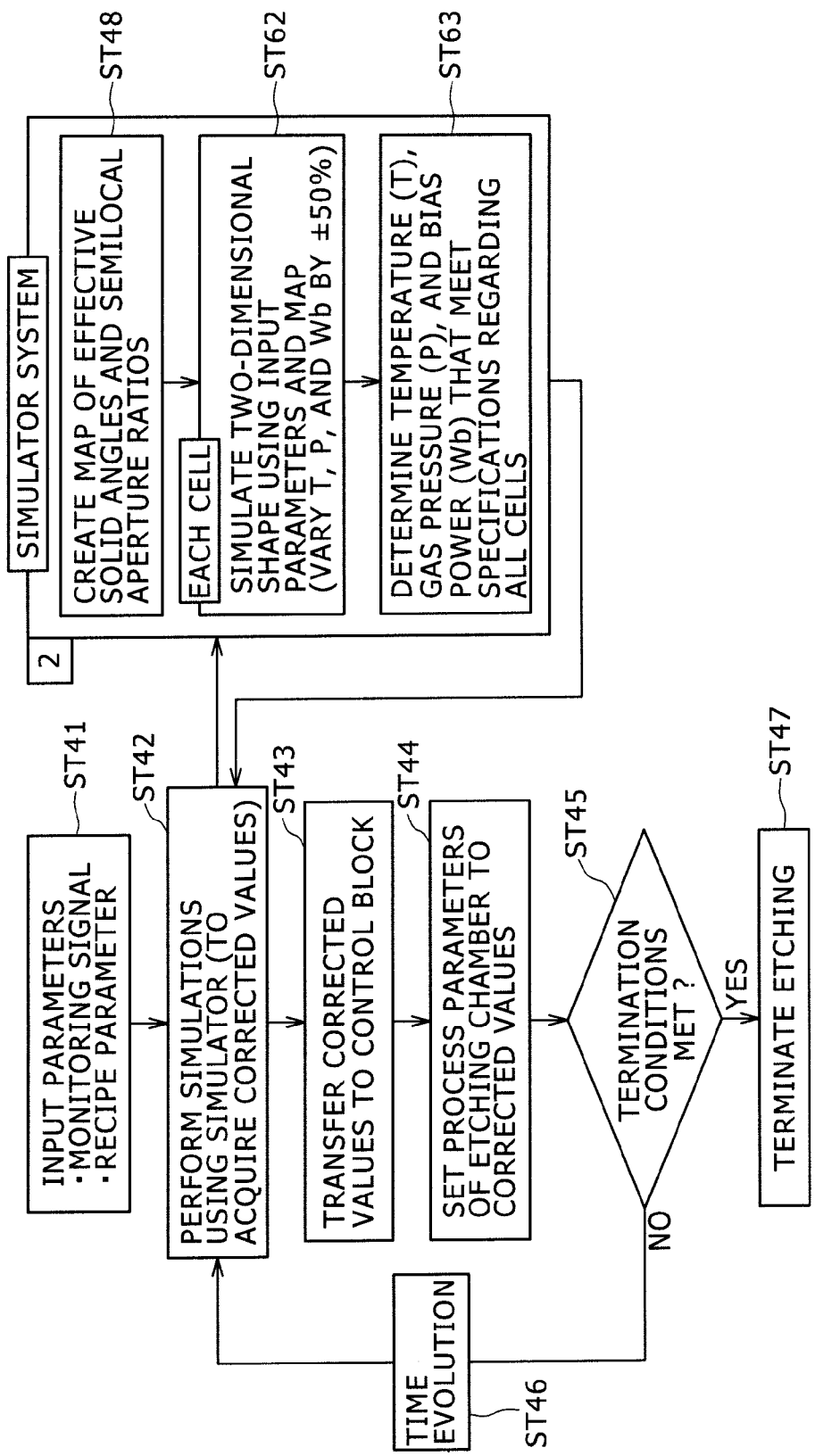
FIG. 17 is a flowchart showing a process parameter correction procedure executed by etching equipment implemented as a fourth embodiment of the present invention.

FIG. 17 is a flowchart showing the process parameter correction procedure executed by the etching equipment implemented as the fourth embodiment of the present invention.

The steps on the left of FIG. 17 (steps ST41 through ST47) are the same as those on the left of FIG. 16. Step ST48 in FIG. 17 is also the same as its counterpart in FIG. 16.

In step ST62, the simulation section 305 performs a simulation using the diverse parameter values contained in the monitoring signal coming from the detection section 303. The simulation makes use of the effective solid angle Se and semilocal aperture ratio Rs calculated in step ST48.

If the CD and other dimensions calculated about all cells 219 through the simulation are determined to fall within the corresponding specification values, then no correction is made.

If the CD and the rest thus calculated are not found to fall within the specification values, then the simulation is performed by varying the lower electrode temperature T, gas pressure P, and bias power Wb within their predetermined indexing ranges. The simulation is continued so as to obtain the lower electrode temperature T, gas pressure P, and bias power Wb which will allow the CD and other dimensions to fall within the specification values.

The above steps are repeated on all cells 219, until the lower electrode temperature T, gas pressure P, and bias power Wb permitting the CD and other dimensions to fall within the specification values are acquired with regard to all cells 219 (in step ST63).

The embodiments discussed above are only examples and are not limitative of the present invention.

With the simulation apparatus of the first embodiment in use, the effective solid angle is updated in keeping with the progress of simulations while the semilocal aperture ratio and wafer aperture ratio are not updated. Alternatively, the semilocal aperture ratio and wafer aperture ratio may also be updated by taking time-induced changes into consideration.

The updates of the effective solid angle, semilocal aperture ratio, and wafer aperture ratio are not limited to those performed based on the wafer shape calculated successively during simulation. Illustratively, these parameters may be updated by increasing or reducing their values at suitable rates as the simulation progresses.

As explained above illustratively in connection with the embodiments, the local region and semilocal region may be established in suitable units such as a calculation point, a cell, or a mesh (i.e., a relatively narrow calculation target region). Alternatively, the local region and the semilocal region may be established in different units. For example, the local region may be established in units of a calculation point while the semilocal region may be set in units of a mesh.

The calculations of the incident flux based on the effective solid angle, semilocal aperture ratio, and wafer aperture ratio are not limited to the method of using operation expressions. Alternatively, the incident flux may be calculated using the map data associating these parameters with incident flux values. Also, the operation expressions are not limited to those indicated above in conjunction with the embodiments. Alternatively, it is possible to utilize operation expressions that take the effects of the higher-order terms of the above parameters into consideration.

The present application contains subject matter related to that disclosed in Japanese Priority Patent Application JP 2009-193334 filed in the Japan Patent Office on Aug. 24, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:
1. A shape simulation apparatus comprising:
a flux computation block configured to compute a flux of particles incident on a surface of a wafer covered with a mask; and
a shape computation block configured to compute a surface shape of said wafer by calculating coordinates of a plurality of calculation points established on the surface of said wafer, the calculated coordinates evolving based on a computed incident flux,
wherein said flux computation block computes said incident flux based on a solid angle, relative to each calculation point for a local region which includes said calculation point of interest and which is left unshielded by any pattern inside said local region; and a wafer aperture ratio of the aperture area of said mask to the area of said mask; and on a semilocal aperture ratio; and further wherein the computed shape information is used as a basis for adjusting one or more processing conditions for processing the wafer.

2. The shape simulation apparatus according to claim 1, wherein
   said flux computation block computes a distribution of said incident fluxes based on a distribution of said solid angles, on said wafer aperture ratio, and on a distribution of said semilocal aperture ratios; and
   said shape computation block computes a three-dimensional surface shape based on the distribution of said incident fluxes.

3. The shape simulation apparatus according to claim 1, wherein said flux computation block computes said incident flux in such a manner that of said incident fluxes, those attributable to an etched film become proportional to said solid angles as well as to the sum of said wafer aperture ratios and said semilocal aperture ratios.

4. The shape simulation apparatus according to claim 1, wherein said local region and said semilocal region are established in a manner centering on each of said calculation points.

5. The shape simulation apparatus according to claim 4, further comprising
   a semilocal aperture ratio map creation block configured to store a plurality of said calculation points in association with a plurality of said semilocal aperture ratios into a storage block,
   wherein said flux computation block computes said incident flux by referencing said plurality of semilocal aperture ratios stored in said storage block.

6. The shape simulation apparatus according to claim 1, wherein
   said wafer has a plurality of chip regions disposed thereon; and
   said semilocal region is established to be smaller than each of said plurality of chip regions.

7. The shape simulation apparatus according to claim 1, wherein the radius of said semilocal region is larger than a mean free path of any one of said particles.

8. A shape simulation program stored in an electronic memory and which is executed by a microprocessor controlled system comprising:
   a flux computation block computing a flux of particles incident on a surface of a wafer covered with a mask; and
   a shape computation block which computes a surface shape of said wafer by calculating coordinates of a plurality of calculation points established on the surface of said wafer, the calculated coordinates evolving based on a computed incident flux,
   wherein said flux computation block computes said incident flux based on a solid angle relative to each calculation point for a local region which includes said calculation point and which is left unshielded by any pattern inside said local region; and based on a wafer aperture ratio of the aperture area of said mask to the area of said mask; and on a semilocal aperture ratio and further wherein the computed shape information is used as a basis for adjusting one or more processing conditions for processing the wafer.

9. A semiconductor production apparatus comprising:
   a detection section configured to detect parameters of an etching process being performed on a wafer covered with a mask;
   a simulation section configured to predict a surface shape of said wafer based on the detected etching process parameters; and
   a control section configured to acquire results of the simulation performed by said simulation section based on the parameters detected by said detection section and to modify etching parameters based on the acquired simulation results, wherein
   said simulation section includes
      a flux computation block configured to compute a flux of particles incident on a surface of said wafer, and
      a shape computation block configured to compute a surface shape of said wafer by calculating coordinates of a plurality of calculation points established on the surface of said wafer, the calculated coordinates evolving based on the computed incident flux, and
   said flux computation block computes said incident flux based on a solid angle relative to each calculation point for a local region which includes said calculation point and which is left unshielded by any pattern inside said local region; and based on a wafer aperture ratio of the aperture area of said mask to the area of said mask; and on a semilocal aperture ratio.

10. A semiconductor device production method comprising:
    detecting parameters of an etching process being performed on a wafer covered with a mask;
    performing a simulation that predicts a surface shape of said wafer; and
    the simulation being based on parameters detected in said detecting step and adjusting etching parameters based on the acquired simulation results, wherein
    said simulation includes
       computing a flux of particles incident on a surface of said wafer, and
       computing a surface shape of said wafer by calculating coordinates of a plurality of calculation points established on the surface of said wafer, the calculated coordinates evolving based on the computed incident flux, and
    computing said incident flux is based on a solid angle relative to each calculation point for a local region which includes said calculation point and which is left unshielded by any pattern inside said local region; on a wafer aperture ratio of the aperture area of said mask to the area of said mask; and on a semilocal aperture ratio.

11. A shape simulation apparatus comprising:
    flux computation means for computing a flux of particles incident on a surface of a wafer covered with a mask; and
    a shape computation means for computing a surface shape of said wafer by calculating coordinates of a plurality of calculation points established on the surface of said wafer, the calculated coordinates evolving based on the computed incident flux,
    wherein said flux computation means computes said incident flux based on a solid angle relative to each calculation point of interest of a local region which includes said calculation point and which is left unshielded by any pattern inside said local region; and based on a wafer aperture ratio of the aperture area of said mask to the area of said mask; and on a semilocal aperture.

12. A semiconductor production apparatus comprising:
    detection means for detecting parameters of an etching process being performed on a wafer covered with a mask;
    a simulation means for predicting a surface shape of said wafer; and
    control means for acquiring results of the simulation performed by said simulation means based on the parameters detected by said detection means and for adjusting etching parameters based on the acquired simulation results, wherein said simulation means includes
- flux computation means for computing a flux of particles incident on a surface of said wafer, and
- shape computation means for computing a surface shape of said wafer by calculating coordinates of a plurality of calculation points established on the surface of said wafer, the calculated coordinates evolving based on the computed incident flux, and said flux computation means computes said incident flux based on a solid angle relative to each calculation point of a local region which includes said calculation point of interest and which is left unshielded by any pattern inside said local region; and based on a wafer aperture ratio of the aperture area of said mask to the area of said mask; and on a semilocal aperture ratio.

* * * * *